United States Patent
Suzuki et al.

(10) Patent No.: US 7,495,965 B2
(45) Date of Patent: Feb. 24, 2009

(54) SEMICONDUCTOR MEMORY DEVICE

(75) Inventors: Toshihiro Suzuki, Kawasaki (JP);
Toshiaki Edahiro, Yokohama (JP);
Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/750,052

(22) Filed: May 17, 2007

(65) Prior Publication Data
US 2007/0268750 A1    Nov. 22, 2007

(30) Foreign Application Priority Data
May 17, 2006   (JP) ............... 2006-137285

(51) Int. Cl.
*G11C 16/06*   (2006.01)
(52) U.S. Cl. .............. 365/185.23; 365/189.09
(58) Field of Classification Search ............ 365/185.23, 365/189.09
See application file for complete search history.

(56) References Cited

U.S. PATENT DOCUMENTS

| | | | |
|---|---|---|---|
| 5,652,726 A | 7/1997 | Tsukude et al. | |
| 6,181,606 B1 * | 1/2001 | Choi et al. | 365/185.23 |
| 6,608,788 B2 | 8/2003 | Ma et al. | |
| 6,700,429 B2 | 3/2004 | Kanno et al. | |
| 6,847,555 B2 | 1/2005 | Toda | |
| 6,885,583 B2 | 4/2005 | Tanaka | |
| 7,085,162 B2 | 8/2006 | Nakamura et al. | |
| 2005/0232013 A1 * | 10/2005 | Kawai et al. | 365/185.18 |
| 2006/0239073 A1 | 10/2006 | Toda | |

FOREIGN PATENT DOCUMENTS

| | | |
|---|---|---|
| JP | 8-167290 | 6/1996 |
| JP | 2003-152096 | 5/2003 |
| JP | 2005-285161 | 10/2005 |

* cited by examiner

*Primary Examiner*—Hoai V Ho
*Assistant Examiner*—Anthan T. Tran
(74) *Attorney, Agent, or Firm*—Oblon, Spivak, McClellend, Maier & Neustadt, P.C.

(57) ABSTRACT

A voltage switching circuit used in a row decoder includes: PMOS transistor P2 and high-voltage NMOS transistor D3 connected in series between VRDEC and TG; PMOS transistor P1 and high-voltage NMOS transistor D2 connected in series between VRDEC and NA; NMOS transistor N2 and high-voltage NMOS transistor D6 connected in series between TG and Vss to be driven by decode output Ab; and NMOS transistor N1 and high-voltage NMOS transistor D5 connected in series between NA and Vss to be driven by decode output Aa. Gates and drains of P1 and P2 are cross-coupled. Gates of D3 and D2 are coupled to TG and NA, respectively.

6 Claims, 19 Drawing Sheets

I-cell, R-cella BLK

R-cellb BLK

FIG. 17

BL0 ——————————— Even

BL1 ——————————— Even

BL2 ——————————— Odd

BL3 ——————————— Odd

BL4 ——————————— Even

BL5 ——————————— Even

BL6 ——————————— Odd

BL7 ——————————— Odd

⋮

BL14 —————————— Odd

BL15 —————————— Odd

US 7,495,965 B2

SEMICONDUCTOR MEMORY DEVICE

CROSS-REFERENCE TO RELATED APPLICATION

This application is based on and claims the benefit of priority from the prior Japanese Patent Application No. 2006-137285, filed on May 17, 2006, the entire contents of which are incorporated herein by reference.

BACKGROUND OF THE INVENTION

1. Field of the Invention

This invention relates to a semiconductor memory device, and more specifically relates to an electrically rewritable and non-volatile semiconductor memory device (EEPROM).

2. Description of the Related Art

A NAND-type flash memory is known as one of EEPROMs. There is increased a demand for NAND-type flash memories in accordance with increasing of the demand for mobile devices, which deal with large capacitive data such as a still or moving image. Being formed of NAND strings (NAND cell units), each of which has multiple memory cells connected in series, a NAND-type flash memory has such features that the unit cell area is small; and it is easy to make the capacity large. While, there is such a drawback that the NAND-type flash memory is not suitable for a high-speed random access-use because the cell current is small.

In consideration of this, the data transmission rate is made high in such a way that data are read out to a page buffer, and then serially output, thereby resulting in that NAND-type flash memory is made adaptable to a high-speed system via a buffer DRAM and the like.

A sense amplifier usually used in the NAND-type flash memory is a voltage detecting type one, which precharges a bit line, and then detects the bit line voltage after discharging it with a cell current for a certain time.

By contrast, there has already been provided a differential sense amplifier of a current sensing type, which is possible to sense a small cell current at a high rate (for example, refer to JP-P2005-285161A). By use of this sensing scheme, in which a pair of bit lines becomes differential inputs, it is also possible to avoid interferences due to capacitances between bit lines.

On the other hand, in accordance with the large capacitive integration of the cell array, the time constant of a word line is made large more and more. Therefore, to effectively use the ability of the high-speed sense amplifier, it is required of a row decoder to be able to drive a word line, which is to be applied with a high voltage, at a high rate. There has been described, for example, in JP-P2002-63795A such a row decoder configured to be suitable for a NAND-type flash memory that has a voltage switching circuit with a high speed and high breakdown voltage performance.

SUMMARY OF THE INVENTION

According to an aspect of the present invention, there is provided a semiconductor memory device including:

first and second cell arrays having bit lines, word lines and electrically rewritable and non-volatile memory cells connected to the bit lines and word lines, main memory cells thereof being used as information cells for storing data while the others are used as reference cells;

a sense amplifier disposed to be selectively coupled to a pair of bit lines selected from the first and second cell arrays, an information cell and a reference cell being coupled to the pair of bit lines, respectively; and a row decoder configured to selectively drive word lines in the first and second cell arrays with a voltage switching circuit for transferring a high voltage supplied to a first node to a second node in accordance with input address, wherein the voltage switching circuit includes:

a first E-type PMOS transistor disposed between the first and second nodes, the drain and gate of which are coupled to the second node and a third nodes, respectively;

a first D-type NMOS transistor disposed between the first node and the source of the first E-type PMOS transistor, the gate of which is coupled to the second node, the first D-type NMOS transistor having a breakdown voltage higher than that of the first E-type PMOS transistor;

a second E-type PMOS transistor disposed between the first and the third node, the drain and gate of which are coupled to the third node and the second node, respectively;

a second D-type NMOS transistor disposed between the first node and the source of the second E-type PMOS transistor, the gate of which is coupled to the third node, the second D-type NMOS transistor having a breakdown voltage higher than that of the second E-type PMOS transistor;

a first E-type NMOS transistor disposed between the second node and the ground potential node to be on-driven at a non-selected time and off-driven at a selected time;

a third D-type NMOS transistor disposed between the second node and the drain of the first E-type NMOS transistor to be on/off-driven simultaneously with the first E-type NMOS transistor, the third D-type NMOS transistor having a breakdown voltage higher than that of the first E-type NMOS transistor;

a second E-type NMOS transistor disposed between the third node and the ground potential node to be off-driven at the non-selected time and on-driven at the selected time; and a fourth D-type NMOS transistor disposed between the third node and the drain of the second E-type NMOS transistor to be on/off-driven simultaneously with the second E-type NMOS transistor, the fourth D-type NMOS transistor having a breakdown voltage higher than that of the second E-type NMOS transistor.

According to another aspect of the present invention, there is provided a semiconductor memory device including:

first and second cell arrays having bit lines, word lines and electrically rewritable and non-volatile memory cells connected to the bit lines and word lines, main memory cells thereof being used as information cells for storing data while the others are used as reference cells;

a sense amplifier disposed to be selectively coupled to a pair of bit lines selected from the first and second cell arrays, an information cell and a reference cell being coupled to the pair of bit lines, respectively; and a row decoder configured to selectively drive word lines in the first and second cell arrays with a voltage switching circuit for transferring a high voltage supplied to a first node to a second node in accordance with input address, wherein the voltage switching circuit includes:

a first E-type PMOS transistor disposed between the first and second nodes to be on-driven at a selected time, the drain of which is coupled to the second node;

a first D-type NMOS transistor disposed between the first node and the source of the first E-type PMOS transistor, the gate of which is coupled to a third node, the first D-type NMOS transistor having a breakdown voltage higher than that of the first E-type PMOS transistor;

a second E-type PMOS transistor disposed between the first and the third node to be on-driven at the selected time;

a second D-type NMOS transistor disposed between the first node and the source of the second E-type PMOS transistor, the gate of which is coupled to the third node, the second D-type NMOS transistor having a breakdown voltage higher than that of the second E-type PMOS transistor;

first and second E-type NMOS transistors serially connected between the third node and the ground potential node with an interconnection node coupled to the second node, the common gate of which is off-driven at the selected time; and a third D-type NMOS transistor connected in parallel with the second D-type NMOS transistor to be on-driven at the selected time, the third D-type NMOS transistor having a breakdown voltage higher than that of the second E-type NMOS transistor.

According to still another aspect of the present invention, there is provided a semiconductor memory device including:

first and second cell arrays having bit lines, word lines and electrically rewritable and non-volatile memory cells connected to the bit lines and word lines, main memory cells thereof being used as information cells for storing data while the others are used as reference cells;

a sense amplifier disposed to be selectively coupled to a pair of bit lines selected from the first and second cell arrays, an information cell and a reference cell being coupled to the pair of bit lines, respectively;

an equalize circuit disposed between the differential input nodes of the sense amplifier to equalize a selected pair of bit lines to be coupled to the sense amplifier; and precharge circuits disposed at the ends of the first and second cell arrays to be opposed to the sense amplifier, respectively, for precharging the selected pair of bit lines.

According to still another aspect of the present invention, there is provided a semiconductor memory device including:

first and second cell arrays having bit lines, word lines and non-volatile memory cells connected to the bit lines and word lines, main memory cells thereof being used as information cells for storing data while the others are used as reference cells; and a read/write circuit with a sense amplifier disposed to be selectively coupled to a pair of bit lines selected from the first and second cell arrays, an information cell and a reference cell being coupled to the pair of bit lines, respectively, wherein a write mode is so defined as to write data in multiple information cells coupled to even numbered bit lines or odd numbered bit lines simultaneously, and wherein adjacent two bit lines are simultaneously selected as even numbered bit lines or odd numbered bit lines in the write mode.

BRIEF DESCRIPTION OF THE DRAWINGS

FIG. 17 shows anther bit line selecting method.

DETAILED DESCRIPTION OF THE EMBODIMENTS

Illustrative embodiments of this invention will be explained with reference to the accompanying drawings below.

[Memory Chip Configuration]

Figure 1:
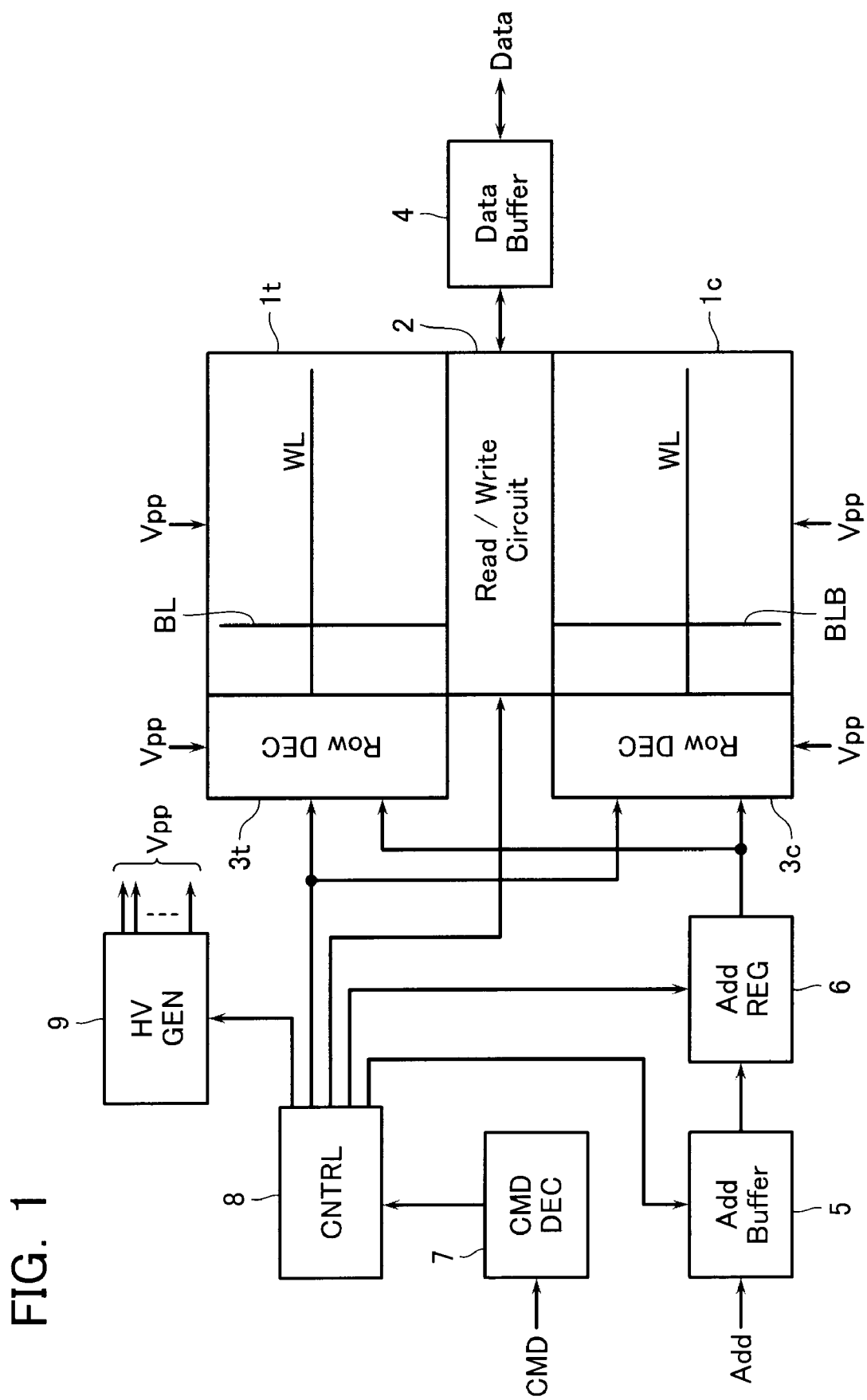
FIG. 1 shows a functional block of a flash memory in accordance with an embodiment of the present invention.

FIG. 1 shows a functional block of a flash memory in accordance with an embodiment. Memory cell array 1 is divided into at least two cell arrays 1$t$ and 1$c$, which are disposed to sandwich a read/write circuit 2. At a data read time, bit lines BL and BLB disposed in the cell arrays 1$t$ and 1$c$, respectively, are simultaneously selected as a bit line pair, which is coupled to a sense amplifier in the read/write circuit 2.

Plural word lines WL are disposed in the cell arrays 1$t$ and 1$c$; and word line selecting/driving circuits (row decoders) 3$t$ and 3$c$ are disposed at the end of the word lines.

The read/write circuit 2 is formed, as described later, in such a manner that one page data may be read with limited sense amplifiers; and it is possible to hold one page write data. Read data are output to external I/O terminals via a data buffer 4, and write data are loaded in the read/write circuit 2 via the data buffer 4.

Externally supplied address "Add" is transferred to the row decoders 3$t$, 3$c$ and column decoder (not shown) via address buffer 5 and address resister 6. Externally supplied command "CMD" is decoded at command decoder 7 and transferred to an internal controller 8, thereby serving for operation controlling.

The internal controller 8 executes a sequence control of write, erase and read operations. To generate various high voltages, which are necessary for write, erase and read operations and boosted to be higher than the power supply voltage Vdd, there is prepared a high voltage generation circuit 9. This generates high voltages necessary for every operation mode under the control of the internal controller 8.

Figure 2:
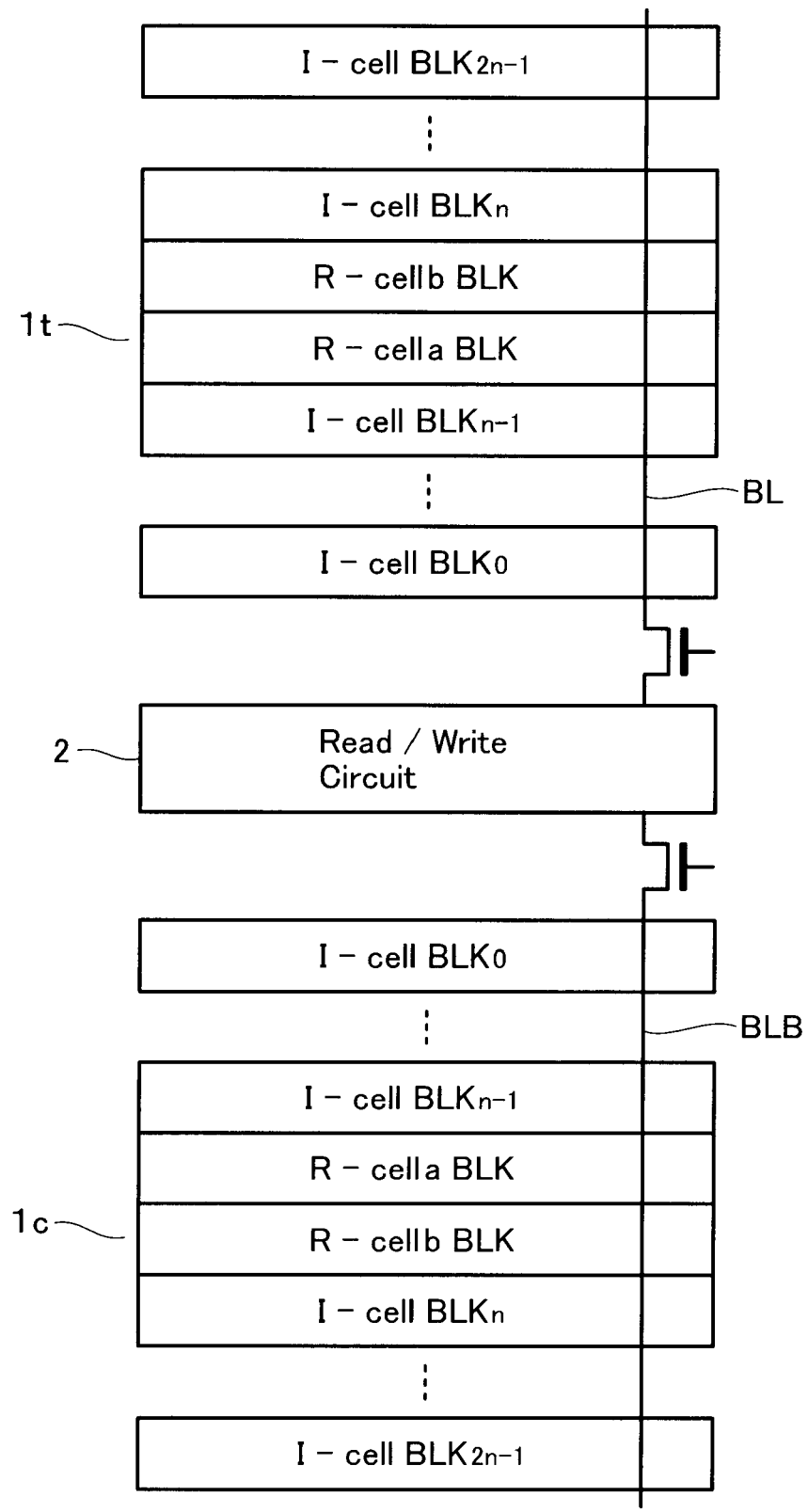
FIG. 2 shows the cell array arrangement of the flash memory.

FIG. 2 shows a block configuration of the cell arrays 1$t$ and 1$c$. As shown in FIG. 2, in each of the cell arrays 1$t$ and 1$c$, 2n information cell blocks I-cellBLKi (i=0 to 2n−1) are arranged. In each information cell block, "information cells" are arranged to store data.

In each of cell arrays 1$t$ and 1$c$, at least one first reference cell block R-cellaBLK is disposed, in which "reference cells" R-cella are arranged for generating reference currents used for data sensing. In detail, when one information cell block I-cellaBLK is selected from the cell array 1$t$, reference cell block R-cellaBLK is selected from the cell array 1c, and the simultaneously selected information cell and reference cell are coupled to a pair of bit lines BL and BLB. Similarly, when one information cell block I-cellBLK is selected from the cell array 1c, reference cell block R-cellaBLK is selected from the cell array 1t.

In the example shown in FIG. 2, the reference cell block R-cellaBLK is disposed at about the center position in the information cell block arrangement in each of the cell arrays 1t and 1c.

Further disposed in each of the cell arrays 1t and 1c in addition to the first reference cell block R-cellaBLK, at least one second reference cell block R-cellbBLK with "reference cells" R-cellb arranged therein for generating a reference current necessary for write-verify and erase-verify of the first reference cell block R-cellaBLK.

As explained later, the reference cell in the first reference cell block R-cellaBLK is formed as being able to be written or erased with the same cell structure as the information cell. By contrast, although the reference cell in the second reference cell block R-cellbBLK is formed with basically the same structure as the information cell I-cell, it constitutes an inactive reference current source, in which write and erase are impossible.

Figure 3:
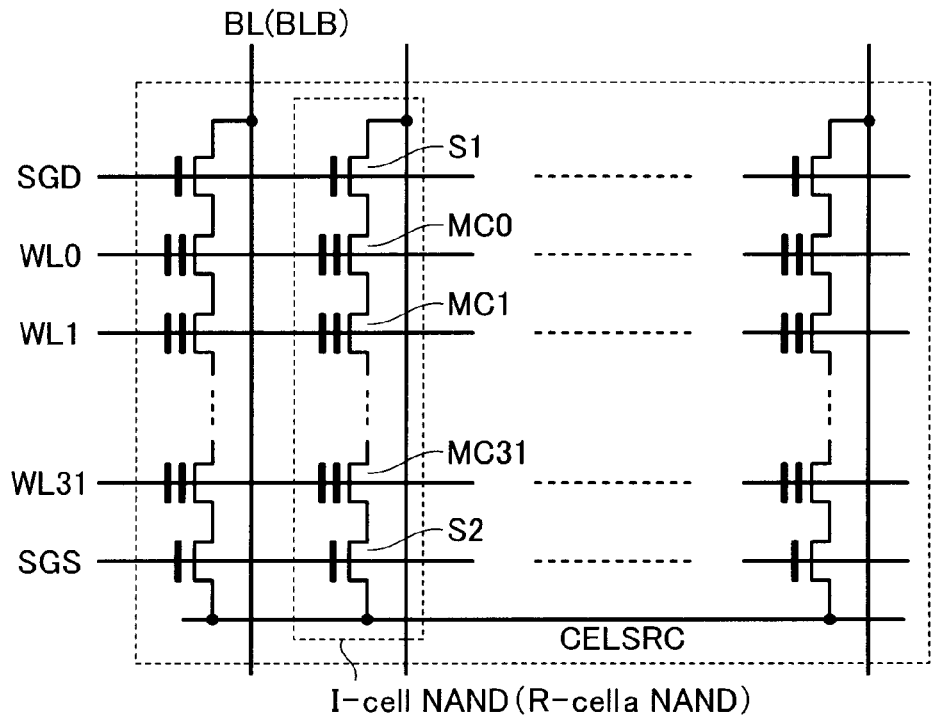
FIG. 3 shows the detailed configuration of I-cell and R-cella blocks.

FIG. 3 shows a common configuration of the information cell block I-cellBLK and the first reference cell block R-cellaBLK in detail. This block is formed of a plurality of NAND cell units (i.e., NAND strings), I-cellNAND or R-cellNAND, which are arranged in a matrix manner.

Each NAND string has a plurality of, thirty two in the example shown in the drawing, electrically rewritable and non-volatile semiconductor memory cells, MC0-MC31, connected in series. Each memory cell is a MOS transistor with a stacked gate structure of a floating gate and a control gate, which stores data in accordance with the carrier storage state of the floating gate in a non-volatile manner.

One end of the NAND string is coupled to a bit line BL (BLB) via a select gate transistor S1; and the other end to a common source line CELSRC via another select transistor S2.

Control gates of the memory cells MC0-MC31 are coupled to different word lines WL0-WL31, respectively. Gates of the select gate transistors S1 and S2 are coupled to select gate lines SGD and SGS, respectively, which are disposed in parallel with the word lines. A set of NAND strings sharing the word lines WL0-WL31 constitutes a "block" serving as a unit of data erase. Usually, there are prepared plural NAND string blocks in the direction of the bit line.

As shown in FIG. 2, each one selected in blocks arranged in each of cell arrays 1t and 1c is set as the first reference cell (R-cella) block R-cellaBLK. While it is optional which NAND blocks are used as the first reference cell blocks, once the first reference cell clocks R-cellaBLK are selected, it should be used fixedly as the first reference cell blocks hereinafter, and others are used as information cell blocks I-cellBLK.

Figure 4:
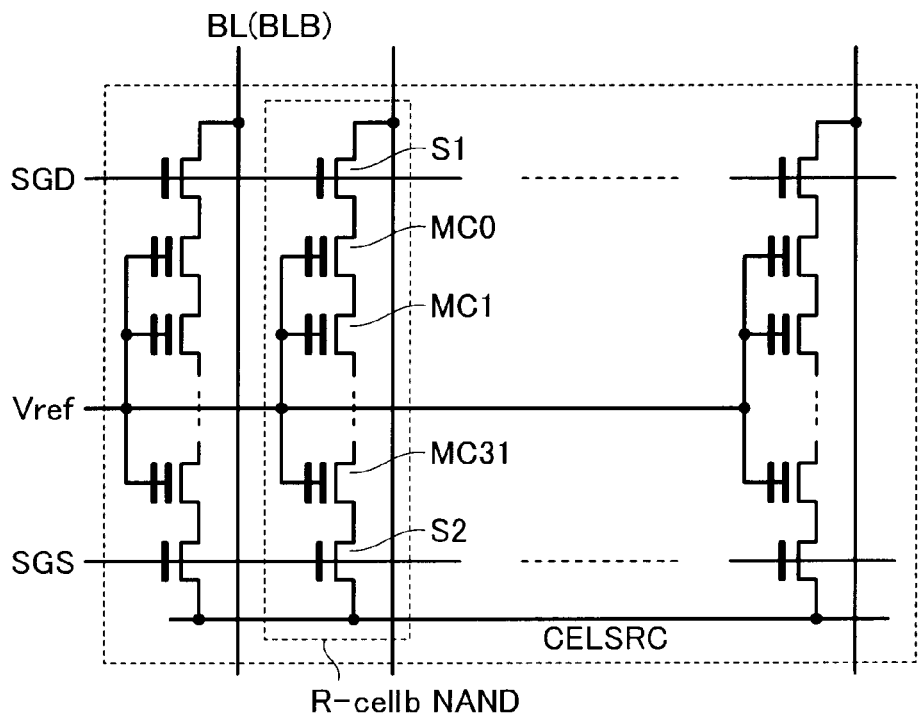
FIG. 4 shows the detailed configuration of R-cellb block.

FIG. 4 shows the configuration of the second reference cell block R-cellbBLK. This is formed of NAND strings, which are basically the same as the information cell block and the first reference cell block. However, in this NAND string R-cellbNAND, the control gates and floating gates of all memory cells MC0-MC31 are coupled to a common gate line, to which reference voltage Vref is applied. That is, the whole memory cells connected in series is operable as a reference current transistor in such a manner that the floating gates are applied with the reference voltage Vref.

The reference current source circuit used for detecting a cell current may be formed and disposed at the input node of the sense amplifier as being separated from the cell array. By contrast, according to this embodiment, in which all reference current sources are formed in the cell array with the same configuration as the cell array, it is unnecessary for using extra transistor areas and possible to obtain a current source with a small variation.

[Memory Operation Principle]

Figure 5:
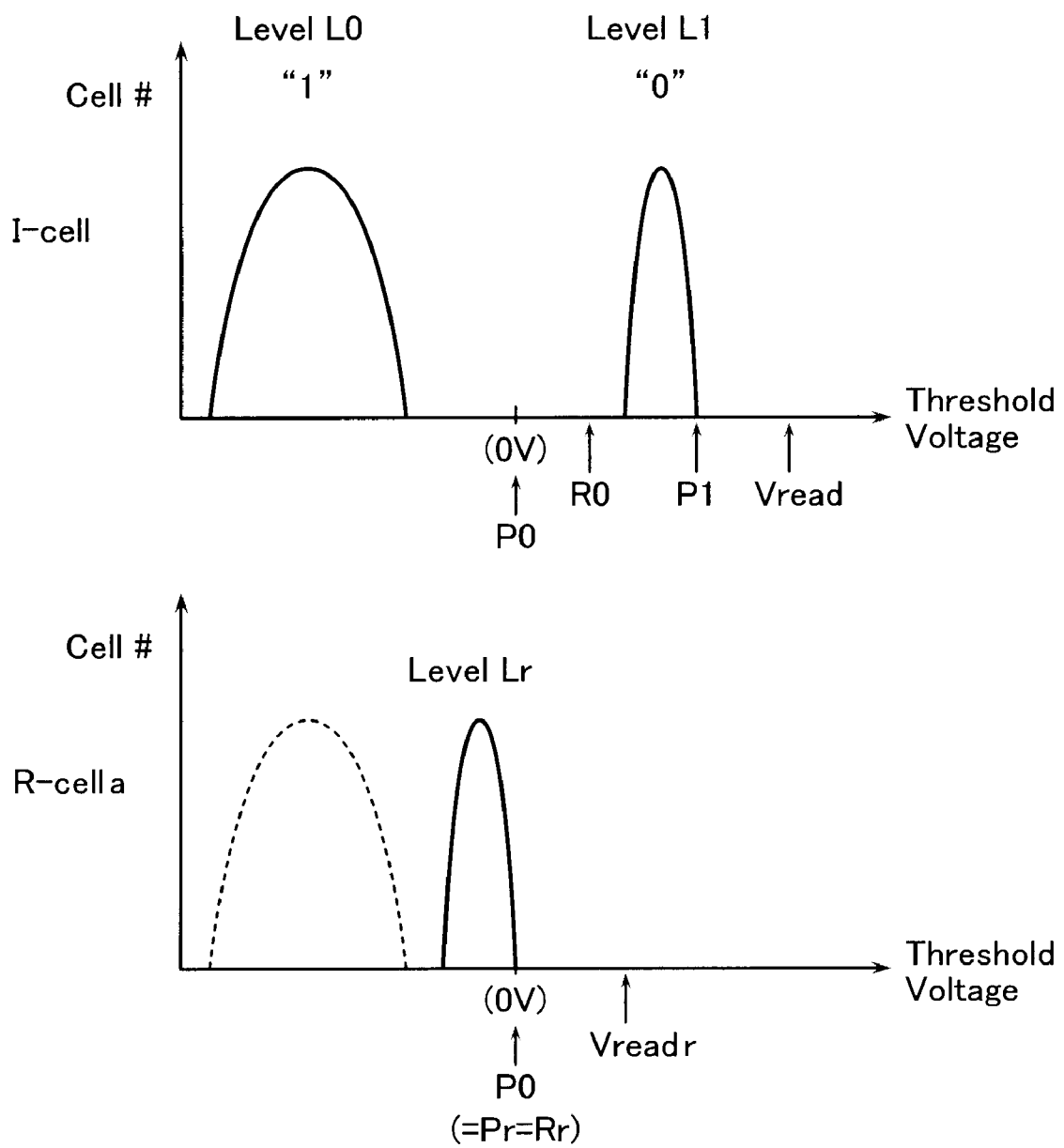
FIG. 5 shows the data threshold distribution in case of a binary data storage scheme.

FIG. 5 shows a data threshold distribution in case of binary data storage scheme. Information cell I-cell stores one bit in such a way that a negative threshold voltage state (i.e., erased state) serves as data "1"; and a positive threshold voltage state (i.e., written state) as data "0".

The reference cell R-cella is written into a positive threshold voltage state near 0V, which serves as a reference level Lr, from the same erased level L0 as in the information cell, prior to the information cell write. With reference to this reference level Lr, the data write and read of the information cell I-cell will be controlled.

Figure 7:
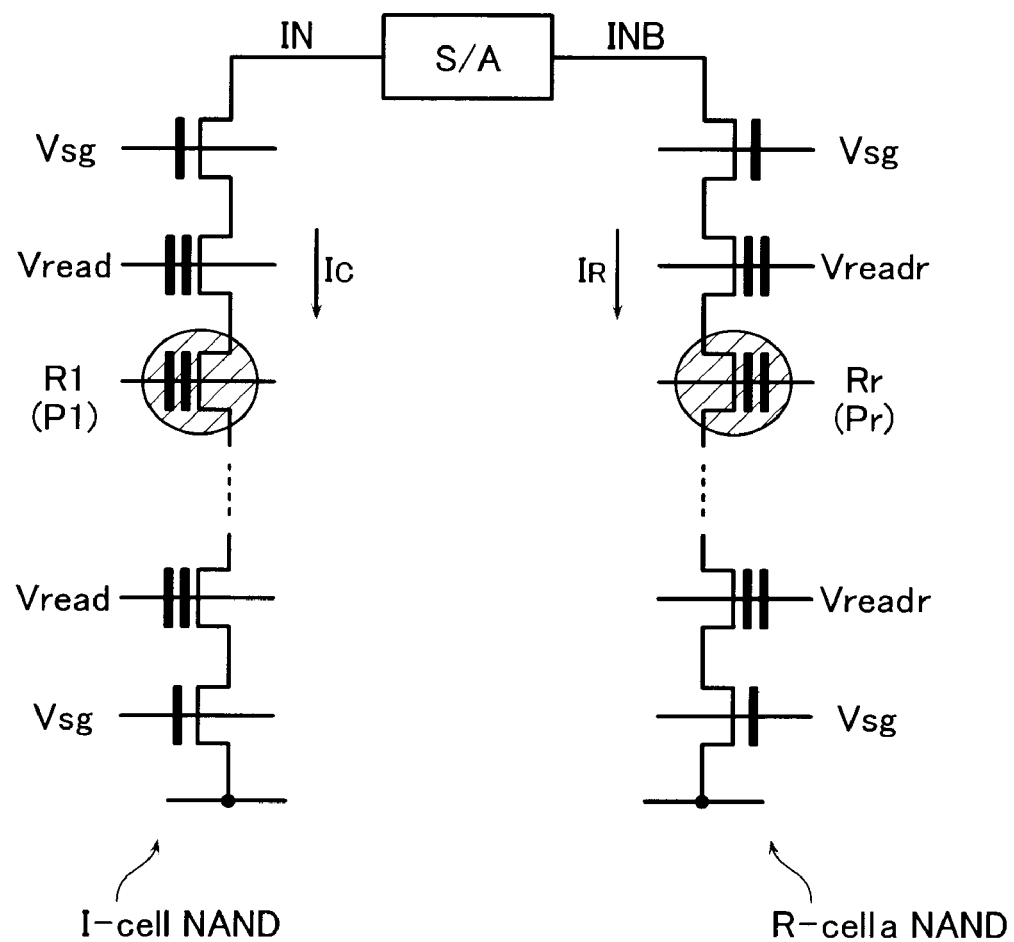
FIG. 7 is a diagram for explaining the sense amplifier scheme.

Data read of "1" or "0" of the information cell I-cell is performed by comparing the cell current with that of the reference cell R-cella. That is, as shown in FIG. 7, with a current detecting type of sense amplifier SA, cell current Ic of an information cell NAND string I-cellNAND is compared with and cell current Ir of a reference cell NAND string R-cellaNAND.

At this time, a selected word line on the information cell NAND, I-cellNAND, side, is applied with read voltage R1 set between the threshold voltages of data "1" and "0"; another selected word line on the reference cell NAND, R-cellaNAND, side, is applied with read voltage Rr; non-selected word lines on the I-cellNAND side, read pass voltage Vread is applied; and non-selected word lines on the R-cellaNAND side is applied with read pass voltage Vreadr (<Vread) is applied.

As a result, if Ic>Ir, data is detected as "1" while if Ic<Ir, data is detected as "0".

Data write will be performed, as similar to that in the ordinary NAND flash memory, as an electron injection operation into the floating gate with a write voltage applied to a selected word line. Write verify-read is performed with the same cell current comparison as the normal read. In FIG. 5, it is shown that selected word lines on the information cell I-cell and the reference cell R-cella sides are applied with verify voltages P1 and Pr, respectively.

Figure 6:
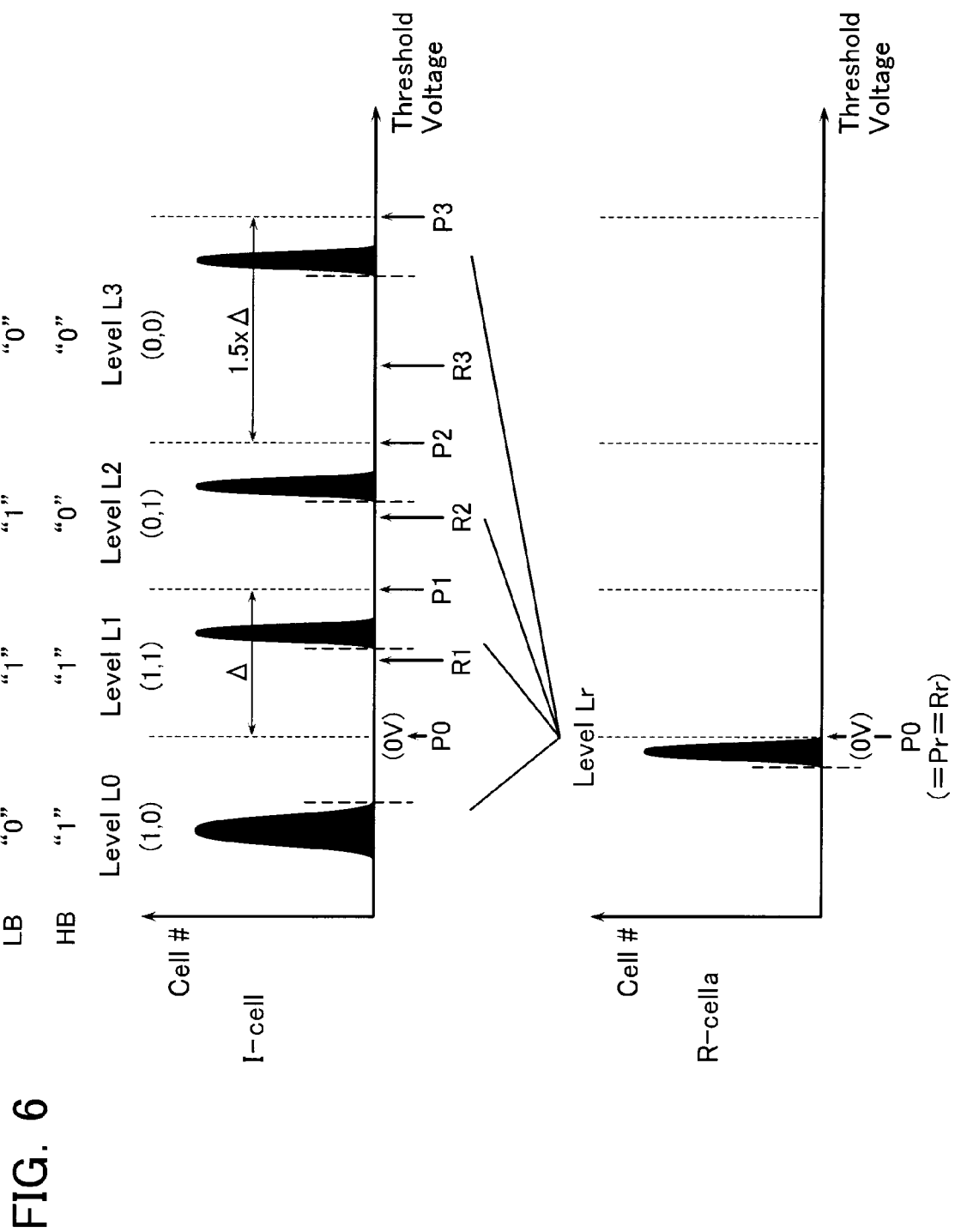
FIG. 6 shows the data threshold distribution in case of a four level data storage scheme.

FIG. 6 shows a data threshold distribution in case of four-level data storage scheme. As shown in FIG. 6, one of three positive threshold states L1, L2 and L3 (where, L1<L2<L3) is written into an information cell I-cell from the erase level L0 (<L1). In the reference cell R-cella, reference level Lr is written like in the binary data storage scheme.

In FIG. 6, data bit assignment of the lower page (LB) and upper page (HB) of four-level data (HB, LB) is set as follows: levels L0, L1, L2 and L3 are defined as (1, 0), (1, 1), (0, 1) and (0, 0), respectively.

To read the upper page, it is detected whether an information cell is in either one of level L2 and L3 states or in either one of level L0 and L1 states with read voltage R2. To read the lower page, it is in need of performing two read steps as follows: one is for distinguishing between level L0 and L1 with read voltage R1; and the other is for distinguishing between level L2 and L3 with read voltage R3. Each read operation is performed as a cell current difference detecting operation between an information cell I-cell and a reference cell R-cella like in the binary data storage scheme.

[Row Decoder Configuration]

Figure 8:
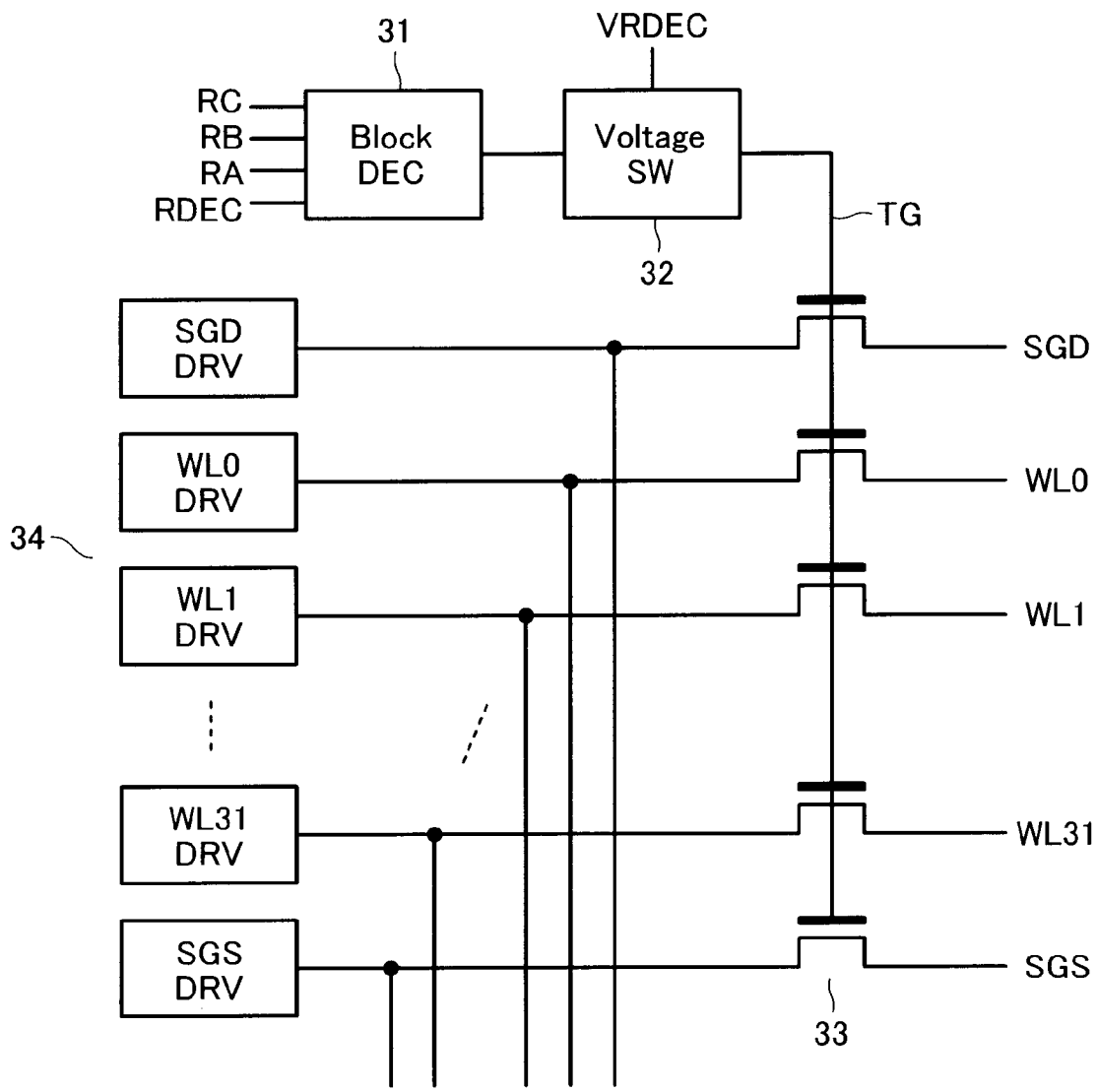
FIG. 8 shows the row decoder configuration.

FIG. 8 shows the configuration of row decoder 3t or 3c, which has a transfer transistor array 33 disposed at each block for transferring driving voltages necessary for word lines and select gate lines. Block decoder 31 is disposed for selecting a block in response to row addresses RA, RB and RC. Voltage switching circuit 32 is disposed for receiving the decoder output to transfer the high voltage VRDEC generated from the high voltage generating circuit to the common gate node TG of the transfer transistor array 33.

Drivers 34 including word line drivers WL0DRV-WL31DRV and select gate line drivers SGDDRV, SGSDRV are disposed in common to multiple blocks for generating driving voltages necessary for word lines and select gate lines in accordance with operation modes and internal block address.

Figure 9:
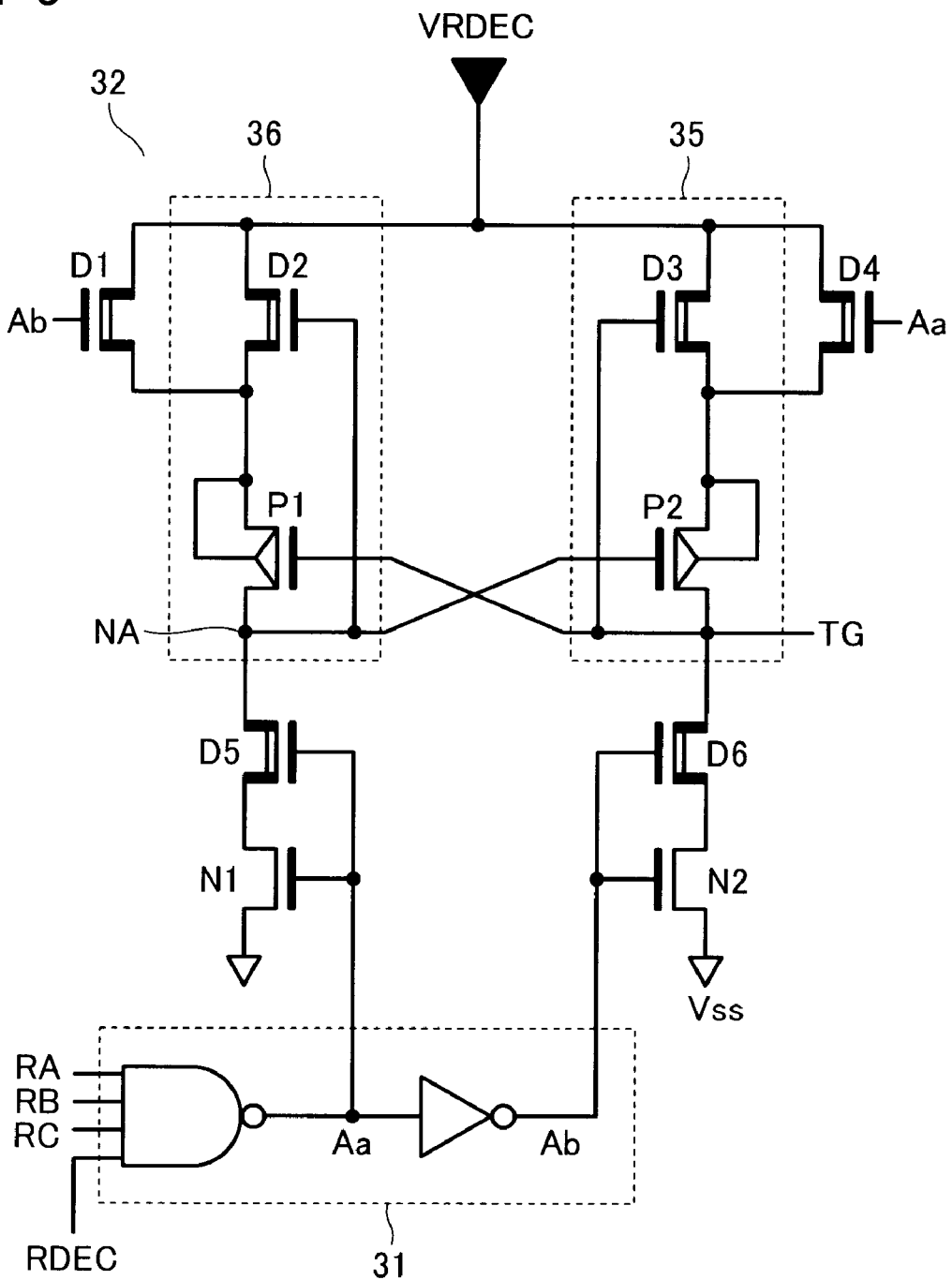
FIG. 9 shows a configuration of the voltage switching circuit.

FIG. 9 shows the detailed configuration of the voltage switching circuit 32, which is specifically formed to be suitable for this embodiment. A main voltage transfer path 35, which is for coupling a node (i.e., first node) supplied with the high voltage VRDEC to the common gate node (i.e., second node) TG of the transfer transistor array 33, is formed of depletion (D)-type NMOS transistor D3 and enhancement (E)-type PMOS transistor P2 connected in series. The drain of PMOS transistor P2 is coupled to the common gate node TG, and disposed between source thereof and the VRDEC node is NMOS transistor D3. This NMOS transistor D3 has a higher breakdown voltage than that of PMOS transistor P2, and the gate of NMOS transistor D3 is coupled to the common gate node TG.

This transfer path 35 is coupled to the ground potential node Vss via a switch circuit formed of D-type NMOS transistor D6 and E-type NMOS transistor N2, the common gate of which is driven by one output Ab of the block decoder 31. That is, the source of NMOS transistor N2 is coupled to the ground potential node Vss, NMOS transistor D6 is disposed between the drain of NMOS transistor N2 and the common gate node TG. The breakdown voltage of NMOS transistor D6 is higher than that of NMOS transistor N2.

To turn on/off the voltage transfer path 35 in accordance with the output of block decoder 31, another voltage transfer path 36 is formed between the VRDEC node and a third node NA with D-type NMOS transistor D2 and E-type PMOS transistor P1 connected in series. The drain of PMOS transistor P1 is coupled to the node NA, and NMOS transistor D2 is disposed between the source of PMOS transistor P1 and VREDEC node. NMOS transistor D2 has a breakdown voltage higher than that of PMOS transistor P1, and gate thereof is coupled to the node NA.

This transfer path 36 is coupled to the ground potential node Vss via another switch circuit formed of D-type NMOS transistor D5 and E-type NMOS transistor N1, the common gate of which is driven by another output Aa of the block decoder 31. That is, the source of NMOS transistor N1 is coupled to the ground potential node Vss, and NMOS transistor D5 is disposed between the drain of NMOS transistor N1 and the node NA. The breakdown voltage of NMOS transistor D5 is higher than that of NMOS transistor N1.

The gate of PMOS transistor P2 on the common gate node TG side is coupled to the node NA (i.e., drain of PMOS transistor P1) while the gate of PMOS transistor P1 on the node NA side is coupled to the common gate node TG (i.e., drain of PMOS transistor P2).

To accelerate the voltage transfer via NMOS transistors D2 and D3, the same kind of D-type NMOS transistors D1 and D4 with a high breakdown voltage are disposed in parallel with NMOS transistors D2 and D3, respectively. Gates of these NMOS transistors D1 and D4 are driven by complementary outputs Ab and Aa, respectively.

The operation of this voltage switching circuit 32 will be explained below. When the output of the block decoder 31 is in a state of Aa="L" and Ab="H" (i.e., non-selected state), transistors N2 and D6 are on, and the common gate node TG is set at Vss. While, in a selected state of Aa="H" and Ab="L", NMOS transistor N1 is turned on; and NMOS transistor N2 off, thereby making the common gate node TG floating. In accordance with that the drain of PMOS transistor P1 is reduced in potential, PMOS transistor P2 is turned on, and the common gate node TG will be boosted via the voltage transfer path 35. At the beginning of this voltage transfer operation, the voltage transferring ability of NMOS transistor D3, the gate of which is coupled to the common gate node TG, is insufficient, but NMOS transistor D5 disposed in parallel with NMOS transistor D3 makes up the ability-insufficiency of NMOS transistor D3. That is, NMOS transistor D4 is driven by Aa="H" to be deeply turned on more than NMOS transistor D3, and it accelerates the voltage transferring of VRDEC to PMOS transistor P2.

As the common gate node TG is further boosted in potential, NMOS transistor D3 is turned on more deeply, and this accelerates the potential boost of the common gate node TG. In addition, PMOS transistor P1 becomes off in response to the potential boost of the common gate node TG, and drain thereof is reduced in potential more. This also makes PMOS transistor P2 on more deeply. With the above described feedback operation, the high voltage VRDEC will be transferred rapidly to the common gate node TG.

By use of this voltage switching circuit 32, it becomes possible to raise the word lines and select gate lines at a high rate. For example, it is necessary to apply a high voltage of about 20V to a selected word line at a write time, and for the purpose of this, it is in need of driving the common gate node TG at a voltage higher than it. According to this embodiment, the above-described high-voltage transfer operation will be performed at a high rate.

When resetting the common gate node TG, NMOS transistor D1 accelerates the high-voltage transferring to PMOS transistor P1 at the beginning. Therefore, the word line voltage will also be stepped down at a high rate.

D-type of high breakdown voltage NMOS transistors D1-D4 support a large voltage when PMOS transistors are turned off, and prevent PMOS transistors P1 and P2 from being applied with a high electric field. Therefore, PMOS transistors are formed as low breakdown voltage devices and high-speed switching devices to be secured voltage-resistant.

D-type of NMOS transistors D5 and D6 serially connected to NMOS transistors N1 and N2, respectively, also prevent NMOS transistors N1 and N2 from being applied with a high voltage. As a result, NMOS transistors N1 and N2 are formed as low breakdown voltage devices and high-speed switching devices to be secured voltage-resistant.

The above-described voltage switching circuit formed in the row decoder in accordance with this embodiment is able to transfer high voltages to the transfer transistor array at a high rate, thereby resulting in that it becomes possible to boost or step down the word lines at a high rate, which are driven via the transfer transistor array. Explaining in detail, it is in need of applying a boosted write voltage of about 20V to a selected word line at a write time while it is necessary to apply a read pass voltage to non-selected word lines at a read time. According to the embodying row decoder, word lines may be driven at a high rate, and it becomes possible to improve the read and write speed performance.

Figure 10:
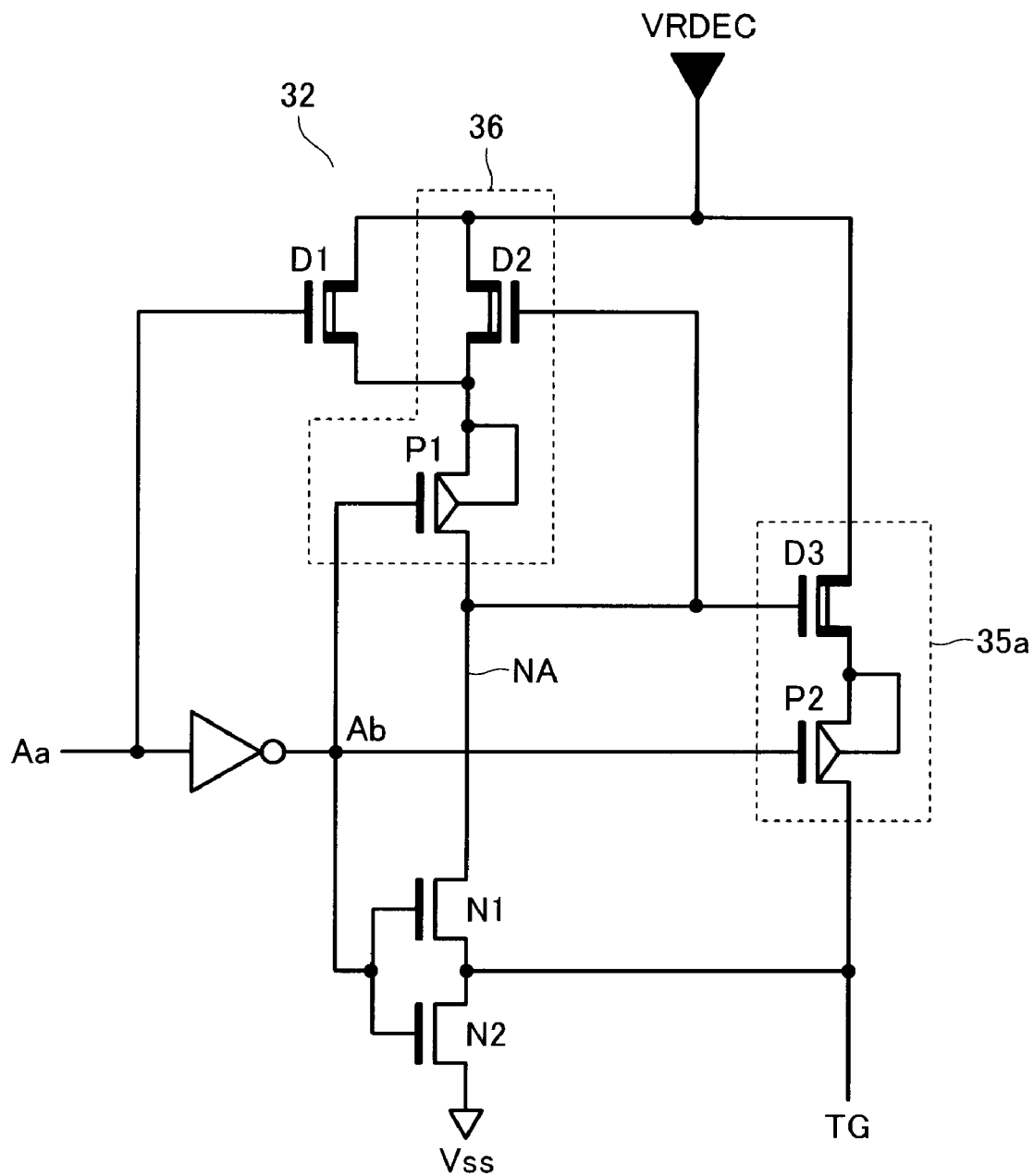
FIG. 10 shows another configuration of the voltage switching circuit.

FIG. 10 shows another example of the voltage switching circuit 32, in which the number of devices is reduced to be less than that shown in FIG. 9. Voltage transfer path 35a disposed between the high voltage VRDEC node (i.e., the first node) and the common gate node TG (i.e., the second node) of the transfer transistor array is formed of D-type of NMOS transistor D3 and E-type of PMOS transistor P2 connected in series. The drain of PMOS transistor P2 is coupled to the common gate node TG, and gate thereof is driven by one, Ab, of the complementary outputs Aa and Ab of the block decoder.

NMOS transistor D3 disposed between PMOS transistor P2 and VRDEC node has a breakdown voltage higher than that of PMOS transistor P2, and gate thereof is coupled to the third node NA. Disposed between the third node NA and the ground potential node Vss are serially connected NMOS transistors N1 and N2, the common gate of which is driven by output Ab. The connection node between NMOS transistors N1 and N2 is coupled to the common gate node TG of the transfer transistor array.

Voltage transfer path 36 disposed between VRDEC node and the third node NA is formed of serially connected D-type of NMOS transistor D2 and E-type of PMOS transistor P1. The drain of PMOS transistor P1 is coupled to the node NA. NMOS transistor D2 disposed between the source of PMOS transistor P1 and VRDEC node has a higher breakdown voltage than that of PMOS transistor P1, and gate thereof is coupled to node NA.

Disposed in parallel with NMOS transistor D2 is the same kind of, D-type of, high breakdown voltage NMOS transistor D1, which is prepared for accelerating the voltage transfer of NMOS transistor D2.

The gate of PMOS transistor P1 is driven by decoder output Ab while the gate of NMOS transistor D1 is driven by another decoder output Aa.

In the non-selected state, which is defined by Aa="L", and Ab="H", PMOS transistors P1 and P2 are off, so that the common gate node TG is set at Vss via NMOS transistor N2.

Being set in the selected state defined by Aa="H", and Ab="L", NMOS transistors N1 and N2 are turned off while PMOS transistors P1 and P2 are turned on. As a result, the common gate TG becomes floating, and high voltage VRDEC is transferred to it via NMOS transistor D3 and PMOS transistor P2. At the beginning of this voltage transfer operation, NMOS transistor D1 is deeply turned on the transfer path 36 side, and this accelerates the gate voltage boost of NMOS transistor D3. Therefore, NMOS transistor D3 is deeply turned on rapidly, thereby resulting in that the common gate TG is boosted at a high rate.

While the switching PMOS transistors P1 and P2 are kept off, high breakdown NMOS transistors (D1, D2) and D3 support high voltages, thereby preventing PMOS transistors P1 and P2 from being broken down. Therefore, according to this voltage switching circuit shown in FIG. 10, it becomes possible to drive the word lines and select gate lines at a high rate with securing the circuit to be breakdown resistant.

[Read/Write Circuit Configuration]

Figure 11:
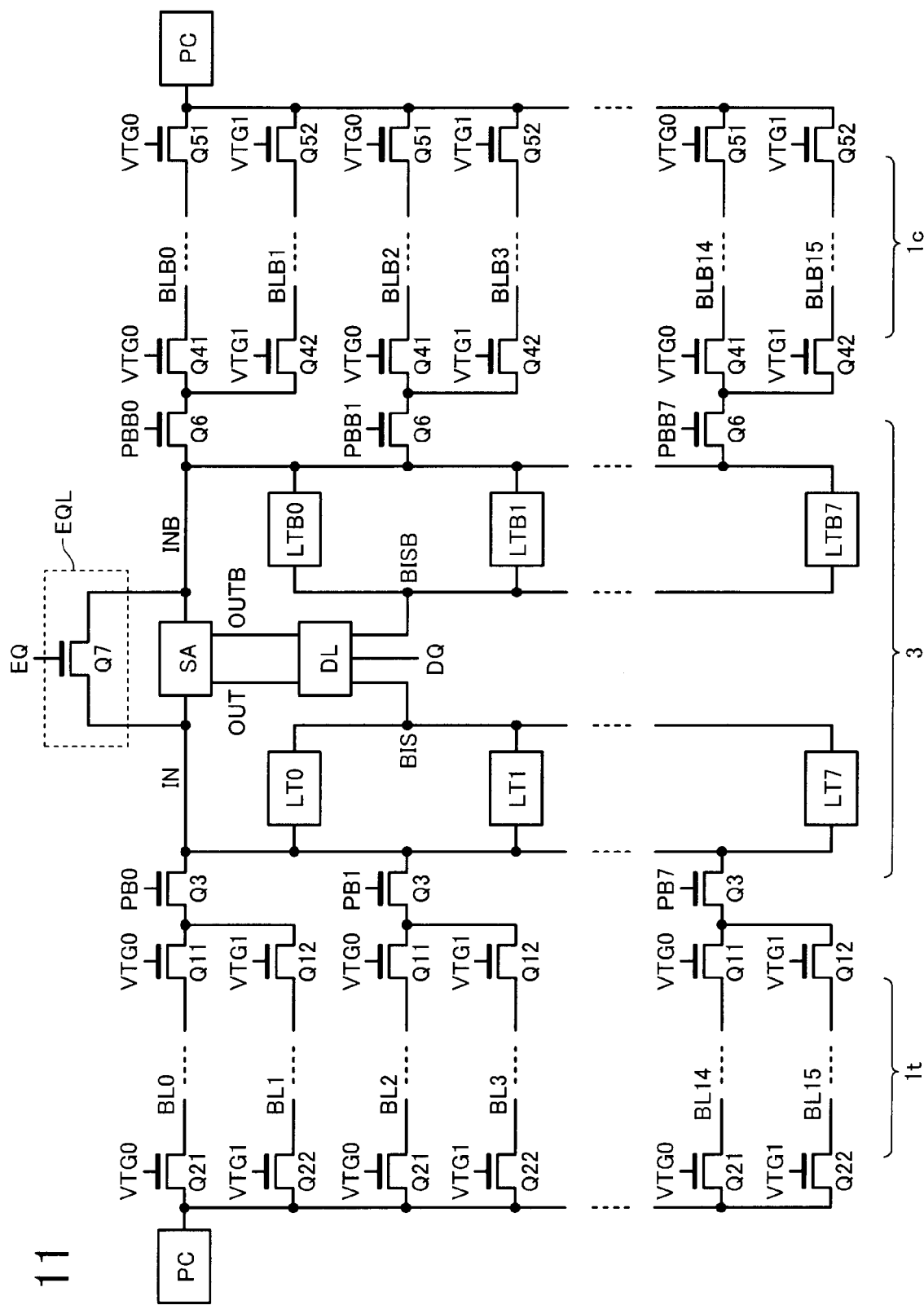
FIG. 11 shows a configuration of the read/write circuit.

FIG. 11 shows a detailed example of the read/write circuit 3 used in a range of 16 bit line pairs. That is, in this example, one sense amplifier SA of a current detecting type is disposed for 16 bit line pairs, which are formed of 16 bit lines BL0-BL15 on the cell array 1t side; and 16 bit lines BLB0-BLB15 on the cell array 1c side.

Even numbered ones and odd numbered ones in the bit lines BL0-BL15 are selected via NMOS transistors Q11 and Q12 driven by signals VTG0 and VTG1, respectively, and one of them is transferred via NMOS transistors Q3 selectively driven by signals PB0-PB7 to be coupled to one input node IN of the sense amplifier SA.

Similarly, even numbered ones and odd numbered ones in the bit lines BLB0-BLB15 are selected via NMOS transistors Q41 and Q42 driven by signals VTG0 and VTG1, respectively, and one of them is transferred via NMOS transistors Q6 selectively driven by signals PBB0-PBB7 to be coupled to the other input node INB of the sense amplifier SA.

To store write data to be written on the bit line BL0-BL15 side, eight data latches LT0-LT7 are disposed in correspondence with eight bit lines, respectively, which are simultaneously written. As well as this, to store write data to be written on the bit line BLB0-BLB15 side, eight data latches LTB0-LTB7 are disposed in correspondence with eight bit lines, respectively, which are simultaneously written.

Output nodes OUT and OUTB of the sense amplifier SA are not only selectively connectable to data line DQ via data transfer processing circuit DL, but also selectively connectable to data transfer nodes BIS and BISB. The data transfer nodes BIS and BISB are disposed in common to data latches LT0-LT7 and LTB0-LTB7, respectively.

In a data write mode, write data supplied via the data line DQ are sequentially loaded in data latches LT0-LT7 or LTB0-LTB7 via the data transfer processing circuit DL and via the transfer node BIS or BISB. Explaining in detail, without regard to which side of bit lines BL and BLB is subjected to data write, write data are loaded in both of data latches LT0-LT7 and LTB0-LTB7. In one of these data latch groups, the write data are rewritten suitable ones used in the next cycle in accordance with the verify-read result; and the other group is kept as it is to be used for verify-controlling until when the data write ends.

Figure 12:
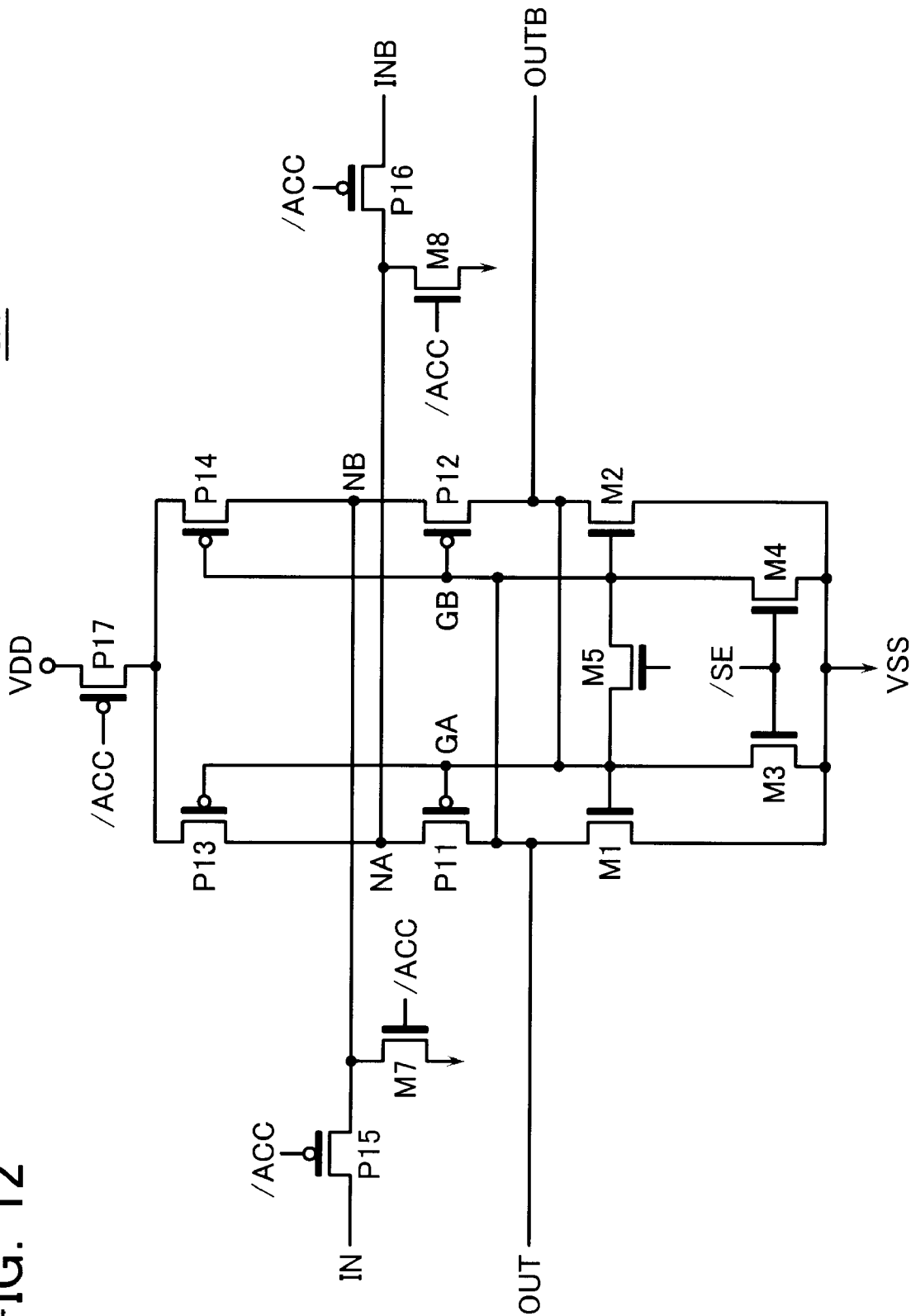
FIG. 12 shows the sense amplifier configuration.

FIG. 12 shows a configuration of the sense amplifier S/A. This sense amplifier S/A is a current detecting type differential amplifier, which has a latch as a main portion with PMOS transistors P11, P12 and NMOS transistors M1 and M2.

The common drain of PMOS transistor P11 and NMOS transistor M1 connected in series with a common gate GA serves as one output node OUT. Similarly, the common drain of PMOS transistor P12 and NMOS transistor M2 connected in series with a common gate GB serves as the other output node OUTB. Common gates GA and GB are cross-coupled to the output nodes OUTB and OUT, respectively.

PMOS transistors P11 and P12 are coupled to the power supply node VDD via PMOS transistors P13 and P14, respectively, and via a current source PMOS transistor P17.

Gates of PMOS transistors P13 and P14 are coupled to the common gates GA and GB, respectively. The gate of PMOS transistor P17 is driven by an activation signal /ACC.

The sources of NMOS transistors M1 and M2 are coupled in common to the ground potential node VSS. The common gates GA and GB are coupled to the ground potential node VSS via NMOS transistors M3 and M4, respectively, the gates of which are controlled by a sense signal /SE. Disposed between the common gates GA and GB, i.e., between the output nodes OUTB and OUT, is NMOS transistor M5, which is on with signal /SE in a stationary state to short-circuit therebetween.

Connection node NB between PMOS transistors P12 and P14 is coupled to an input node IN via PMOS transistor P15, which is controlled with the activation signal /ACC. Connection node NA between PMOS transistors P11 and P13 is coupled to another input node INB via PMOS transistor P16, which is controlled with the activation signal /ACC. These transistors P15 and P16 serve for distinguishing between a bit line precharge state and a sense amp waiting state, thereby making the sense amplifier operation time short and the power consumption small.

Disposed at the nodes NB and NA are reset-use NMOS transistors M7 and M8, which are driven by the activation signal /ACC. These transistors serve for setting the nodes NB and NA at VSS when the sense amplifier S/A is inactive (i.e., /ACC="H").

The operation of this sense amplifier S/A will be explained below. In a normal data read mode, this sense amplifier detects a current difference between an information cell I-cell and a reference cell R-cella, which affects the input nodes IN and INB. In an inactive state while /ACC="H", and /SE="H", nodes GA, GB, NA, NB and output nodes OUT, OUTB are set at VSS. At this time, the output nodes OUT and OUTB are short-circuited via NMOS transistor M5.

When one word line is selected from each of two cell arrays, and one pair of bit lines BL and BLB are coupled to the input nodes IN and INB, /ACC becomes "L", and a little later /SE becomes "L". Supposing that an information cell I-cell and a reference cell R-cella are selected and coupled to the bit lines BL and BLB, respectively, cell currents thereof are supplied to the nodes NB and NA, respectively.

Just after the sense amplifier activation, while NMOS transistors M1 and M2 are kept off, PMOS transistor P17 is turned on. Therefore, the output nodes OUT (=GB) and OUTB (=GA), which have been reset at VSS, will be charged up with the power supply current from VDD and cell currents superimposed thereon. In response to /SE="L", NMOS transistors M3-M5 are kept off.

A potential difference being generated between the output nodes OUT and OUTB (i.e., between the common gate modes GA and GB) based on the cell current difference, a positive feed back operation occurs to amplify the voltage difference between output nodes OUT and OUTB, so that the voltage difference will be increased rapidly.

Supposing, for example, that OUT (=GB) is lower in potential than OUTB (=GA), in accordance with the positive feedback from /SE, NMOS transistor M1 becomes on; NMOS transistor M2 off; PMOS transistor P11 off; and PMOS transistor P12 on. As a result, output nodes OUT and OUTB will be set at VSS and VDD, respectively.

To perform data sense based on a small cell current with the current detecting type of sense amplifier, it is required of the bit lines constituting a pair to have time constants equal to each other. For example, supposing that an information cell is selected on the bit line BL side; and a reference cell R-cella on the bit line BLB side, as understood from FIG. 2, the reference cell position is constant while the information cell position is changed in accordance with address. Therefore, it is not always satisfied that the load capacitances of the two input nodes IN and INB of the sense amplifier SA are equal to each other.

According to this embodiment, in consideration of the above-described situation, equalizing/precharging for a bit line pair of BL and BLB will be adapted as follows. Firstly, as shown in FIG. 11, equalizing NMOS transistor Q7 is disposed between the input nodes IN and INB of the sense amplifier SA, the gate of which is driven by an equalizing signal EQ. That is, this transistor Q7 constitutes a bit line equalizing circuit EQL. By use of this equalizing circuit EQL, it becomes possible to equalize the bit lines BL and BLB selected as a pair near the sense amplifier prior to data sensing.

However, even if this equalizing scheme is used, it is impossible to sufficiently remove the potential variations between the bit lines BL and BLB at the ends far from the sense amplifier SA. Therefore, secondly, bit line precharge circuits PC are disposed at the ends of bit lines BL and BLB far from the sense amplifier SA. At these bit line ends, bit line select transistors Q21, Q22 and Q51, Q52 are disposed, and selected bit lines will be precharged with these precharge circuits PC.

At a data read time, selected bit lines BL and BLB constituting a pair are precharged, and information cell data and reference cell data are output to these bit lines to be sensed with the sense amplifier SA. However, if a non-selected bit line adjacent to a selected bit line is kept at 0V, capacitive coupling between bit lines prevents the selected bit line from being precharged at a high rate.

In consideration of this, it is desirable to use such a bit line precharge scheme that two non-selected bit lines disposed adjacent to a selected bit line are precharged simultaneously with the selected bit line. With this scheme, the influence due to the bit line capacitive coupling may be removed, and it becomes possible to achieve a high speed performance of the bit line precharge.

The above-described bit line precharge scheme will be explained in detail with reference to FIG. 13. Here is shown only the bit line BL side. Bit lines are classified into multiple units UNIT0-UNITn−1, each of which includes 16 bit lines BL0-BL15. Basically a combination of two bit lines is selected with signals PB0-PB7, one of which is selected with signals Vtg0-Vtg3 to be coupled to the sense amplifier SA.

For example, supposing that, as shown by arrows, bit line BL1 is selected in unit UNITi. At this time, when precharge current PC1 is supplied to bit line BL1, precharge currents PC0 and PC2 are supplied simultaneously to bit liens BL0 and BL2, respectively.

In other words, when signal Vtg1 is set at "H", signals Vtg0 and Vtg2, which select adjacent bit lines, are also set at "H" simultaneously, and additionally two select signals PB0 and PB1 are set at "H" simultaneously, so that three bit lines BL0-BL2 are precharged simultaneously from the precharge circuit PC.

Figure 14:
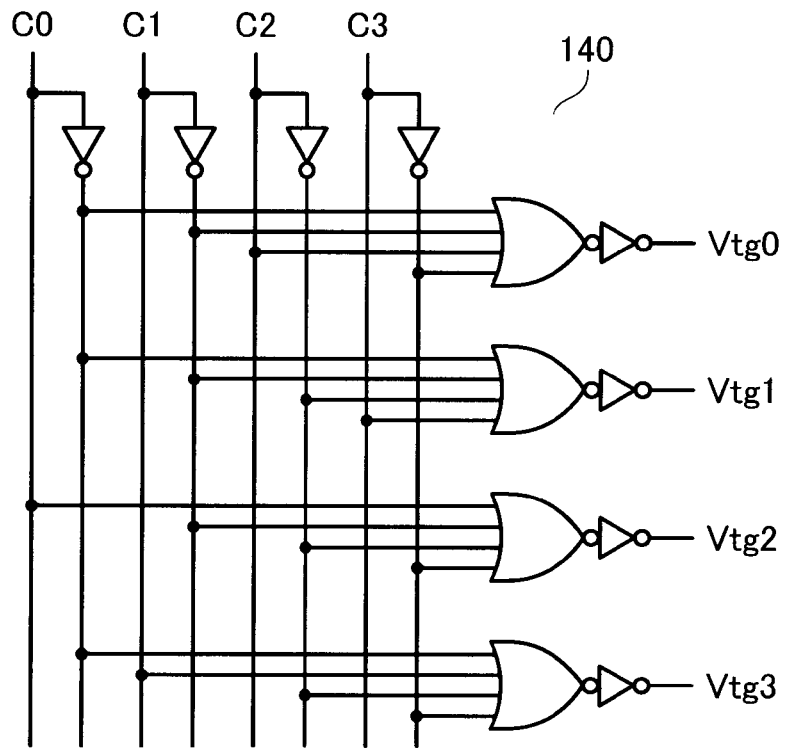
FIG. 14 shows select signal generating circuit 140.

FIG. 14 shows a select signal generating circuit 140 for setting three select signals (corresponding to successive three bit lines) in Vtg0-Vtg3 to be "H" simultaneously in response to signals C0-C3, either one of which is set at "0". This is, a wired-OR logic circuit is formed, which functions as follows: a combination of (Vtg0, Vtg1, Vtg2) is selected with C0="0"; another combination of (Vtg1, Vtg2, Vtg3) is selected with C1="0"; and the like.

Figure 15:
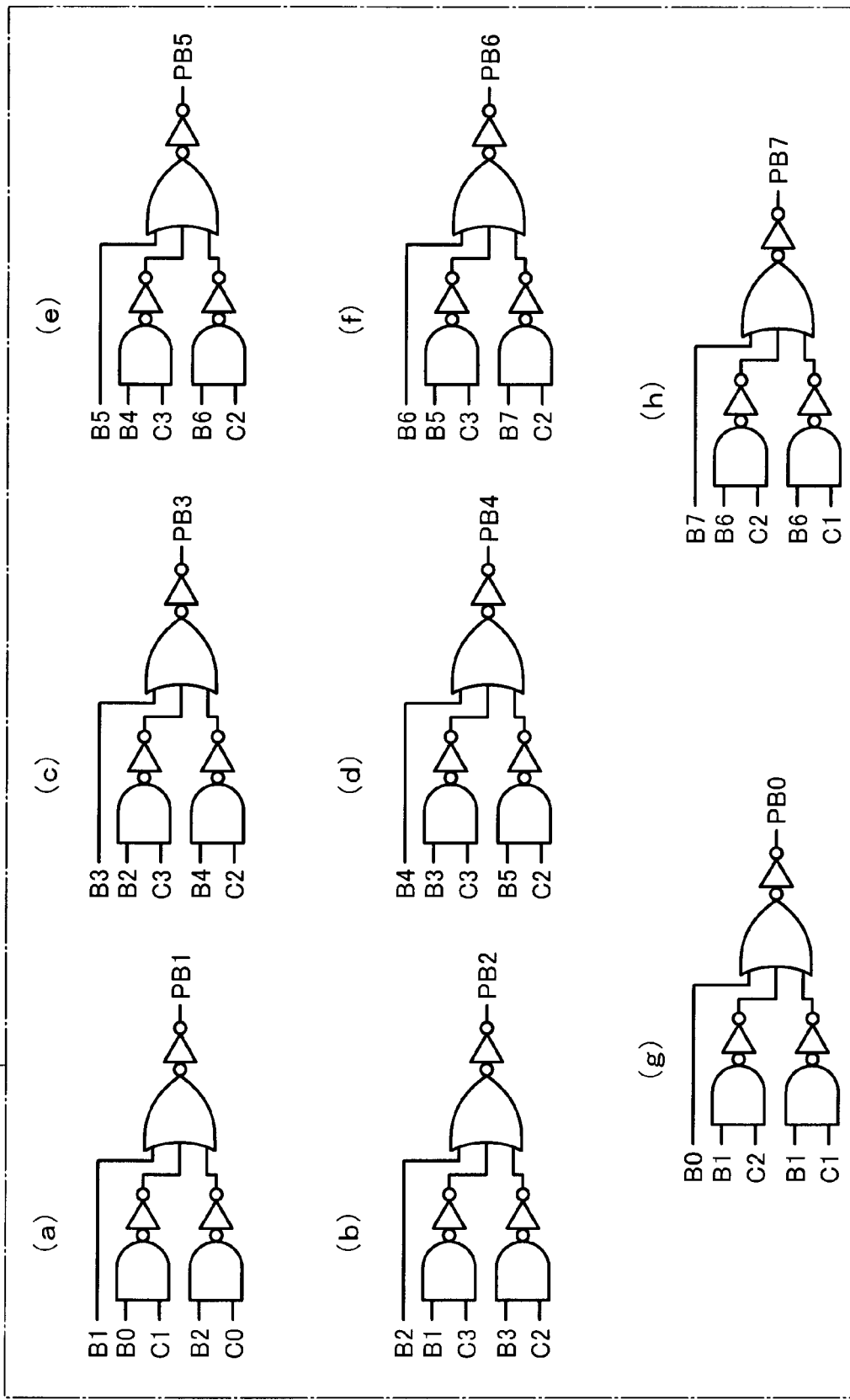
FIG. 15 shows select signal generating circuit 150.

Further, it is required of the successive two in eight select signals PB0-PB7 to be set at "H" simultaneously. For this purpose, a select signal generation circuit 150 will be formed as shown in FIG. 15 for generating the select signals PB0-PB7. To set one of the select signals PB0-PB7 to be "H" when one of input signals B0-B7 is "0", NOR gate portions are prepared. Further, there are additionally formed logic circuits, which take certain logics between signals C0-C3 and B0-B7 for setting select signal PBk−1 or PBk+1 to be "H" when select signal PBk is "H".

When a bit line is selected at the end of a first unit, one of adjacent two bit lines is disposed at the end in a second unit adjacent to the first unit to be selected, whereby total three bit lines should be precharged simultaneously. To generate select signal PB0 and PB7 for selecting the unit edges, circuits (g) and (h) in FIG. 15 will be used.

Figure 16:
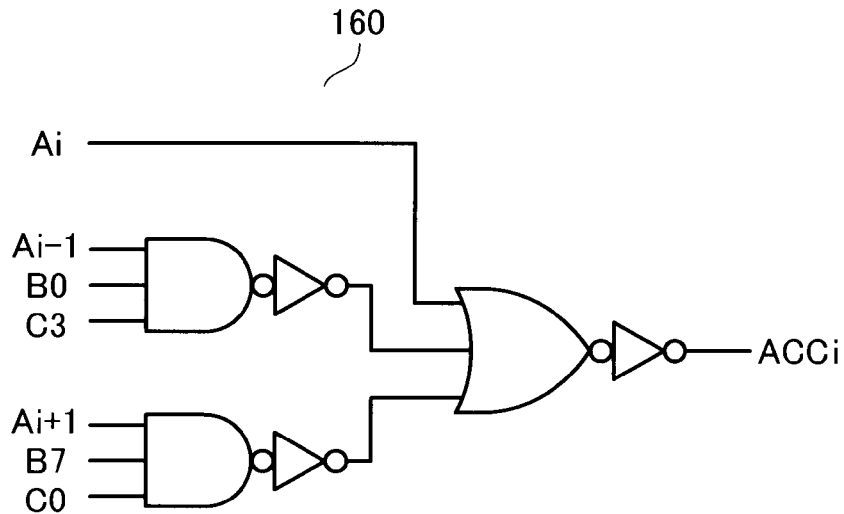
FIG. 16 shows activation signal generating circuit 160.

Additionally, to precharge a bit line at the unit edge, it is required of the adjacent unit to be activated. To generate an activation signal ACCi used for precharging, activation signal generating circuit 160 shown in FIG. 16 will be used. This circuit is formed to be subjected to such a logic process that when a bit line is selected at the unit edge, adjacent unit thereof is activated.

Bit lines BL15 and BL0 disposed at the ends of units UNIT0 and UNITn−1, respectively, which are disposed on the opposite sides of the cell array, have no bit lines outside. Therefore, to adapt such the bit line scheme that three bit lines are simultaneously precharged with a selected bit line contained in the center to the whole bit lines, the both end bit lines BL15 and BL0 should not be used as data lines, but should be used as dummy bit lines. That is, these dummy bit lines each will be used only for precharging itself when bit line BL14 or BL1 adjacent to it is selected and precharged.

As described above, precharging three bit lines simultaneously, it becomes possible to do a high-speed bit line precharge operation without influences due to capacitances between bit lines, and reduce the bit line potential variations. As a result, a high-speed data read becomes possible.

At a normal data write time, for example, when information cells on the bit line BL side are written, write data are loaded in data latches LT0-LT7, and information cells on the even numbered bit lines or odd numbered bit lines are written in a lump. However, according to this write scheme, as the capacitance coupling between cells on adjacent bit lines (in detail, between floating gates) is increased due to cell array miniaturization, data variations will be increased more.

Supposing that, for example, after writing cells selected by a word line and the even numbered bit line, other cells selected by the same word line and the odd numbered bit lines are written. The former cells on the even numbered bit lines are written under the condition that adjacent cells are in an erase state. However, as a result of that adjacent cells are written thereafter, the data of the former cells may be largely varied due to capacitance couplings between floating gates. Especially in a multi-level data storage scheme, in which it is in need of controlling the threshold distributions to have narrow gaps therebetween, there is a fear of that some data threshold distributions may be overlapped therebetween.

To improve this problem, it is effective to use such an even/odd bit line selection scheme at a write time, as shown in FIG. 17, that adjacent two bit lines are selected simultaneously as even numbered bit lines (Even); and the successive adjacent two bit lines are selected simultaneously as odd numbered bit lines (Odd). In case data write is performed in accordance with the above-described bit line selection scheme, the number of cells influenced by write data in adjacent cells is reduced to be half in comparison with that in the normal even/odd bit line selection scheme. Therefore, as a whole, the variations of data threshold distributions due to capacitive coupling between cells will be suppressed.

Figure 18:
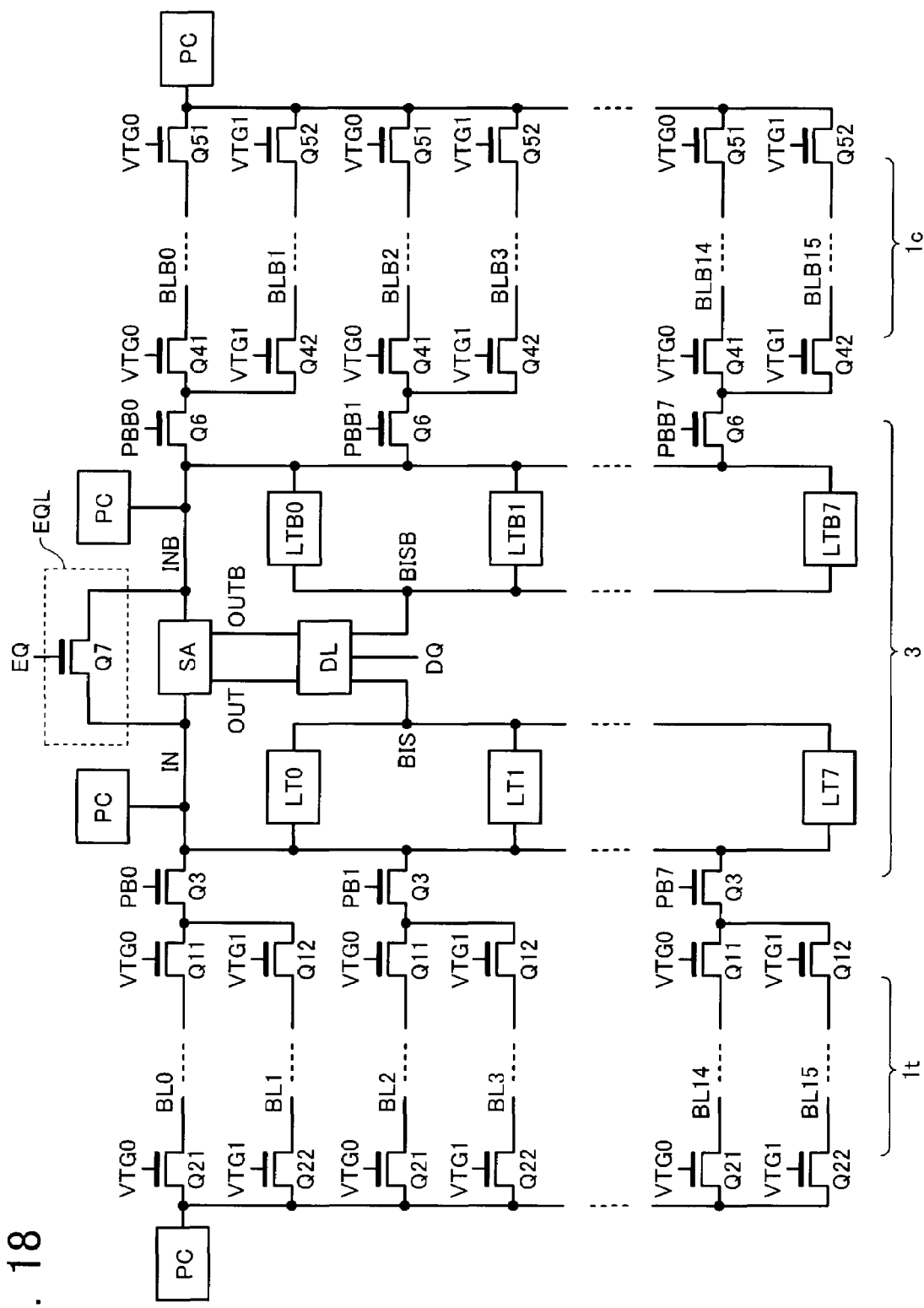
FIG. 18 shows anther read/write circuit.

Further, in FIG. 11, bit line precharge circuits PC are disposed on the ends of the bit lines BL and BLB in the cell arrays 1t and 1c as opposed to the sense amplifier SA. By contrast, as shown in FIG. 18, it is effective to dispose the bit line precharge circuits PC on the opposite sides of the bit lines. With this bit line precharge circuit arrangement, the both bit line precharge circuits PC are activated simultaneously at the bit line precharge time, so that it becomes possible to reduce the bit line precharge variations more and make the precharge time shorter.

This invention is not limited to the embodiments as described above.

For example, the row decoder with the voltage switching circuit as shown in FIG. 9 or FIG. 10 is adaptable to not only the NAND-type flash memory with the reference cell scheme as explained in the embodiments but also other semiconductor memories, in which high voltage word line driving is necessary, such as a conventional NAND flash memory and the like.

The bit line equalize and precharge scheme as explained in the read/write circuit shown in FIG. 11 also is not limited to the memory with the reference cell scheme. That is, the bit line equalize and precharge scheme is effectively adaptable to other kinds of flash memories, which have a cell array with long bit lines and a differential sense amplifier with deferential input nodes coupled to a pair of bit lines.

Figure 13:
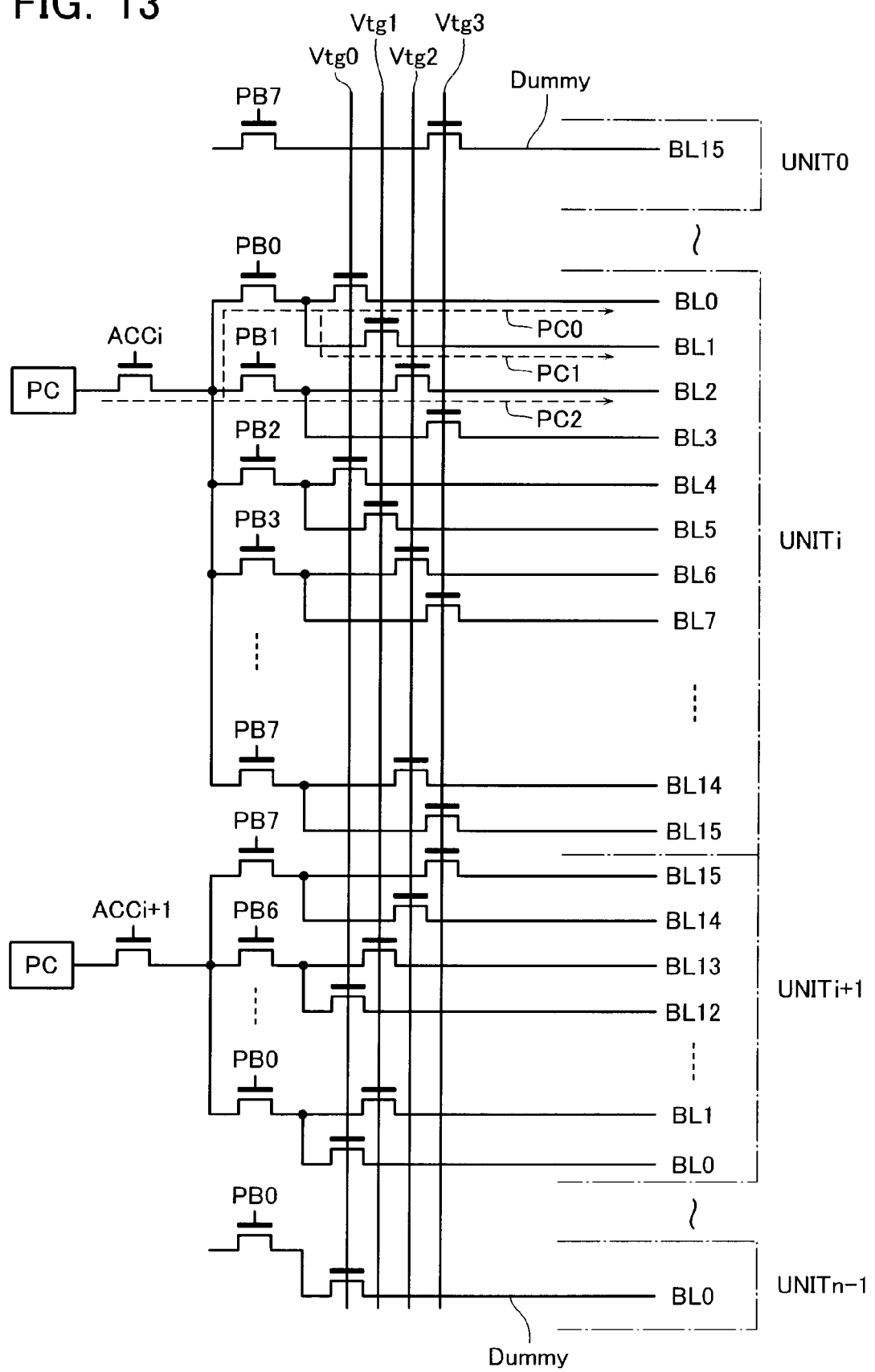
FIG. 13 is a diagram for explaining the bit line precharge scheme.

The precharge scheme shown in FIG. 13, which is configured to precharge three adjacent bit lines simultaneously, is also adaptable to such kinds of other flash memories that bit lines are selected on the other line.

The even/odd bit line selecting scheme, which is used at a write time as explained with reference to FIG. 17, is also adaptable to such kinds of other flash memories that collective write is performed for even numbered bit lines or odd numbered bit lines.

[Application Devices]

As an embodiment, an electric card using the non-volatile semiconductor memory devices according to the above-described embodiments of the present invention and an electric device using the card will be described bellow.

Figure 19:
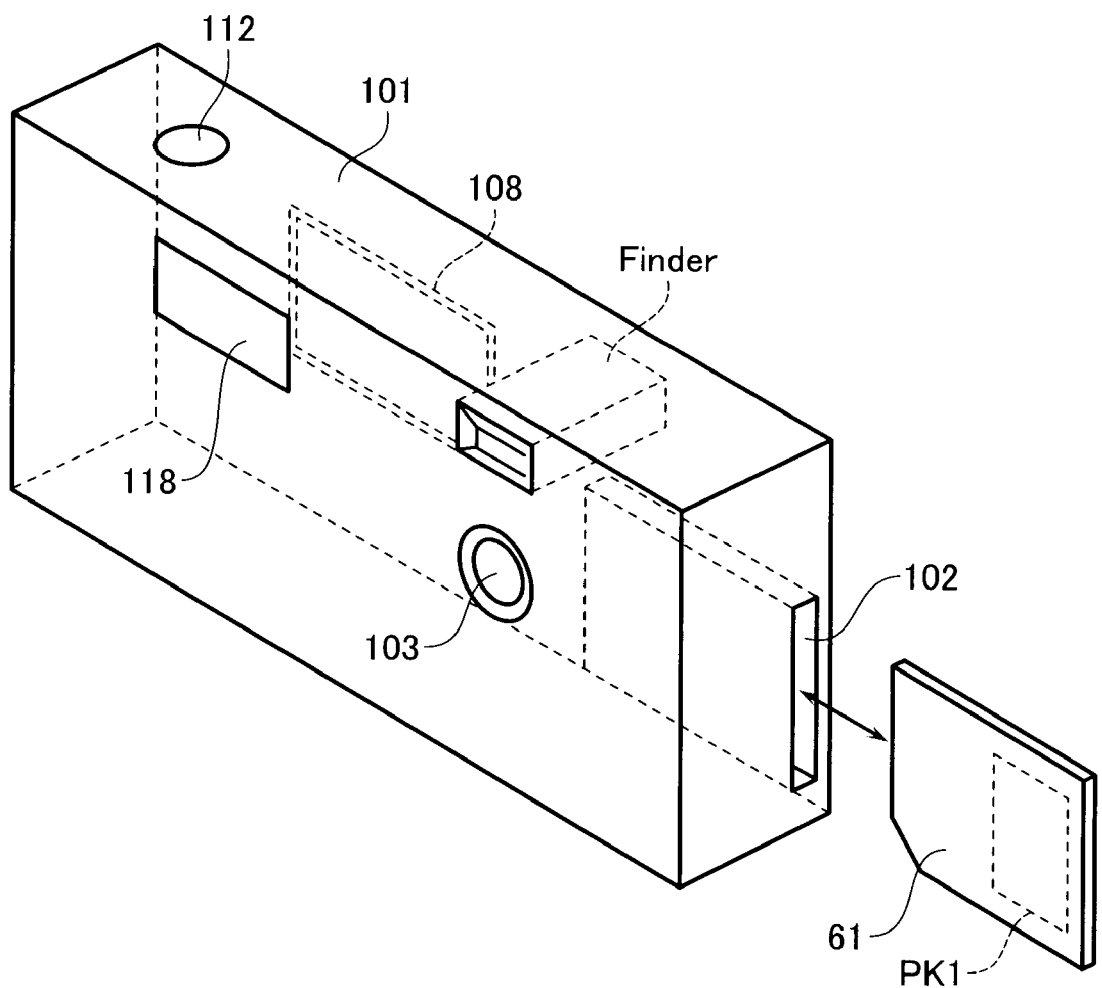
FIG. 19 shows another embodiment applied to a digital still camera.

FIG. 19 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 20:
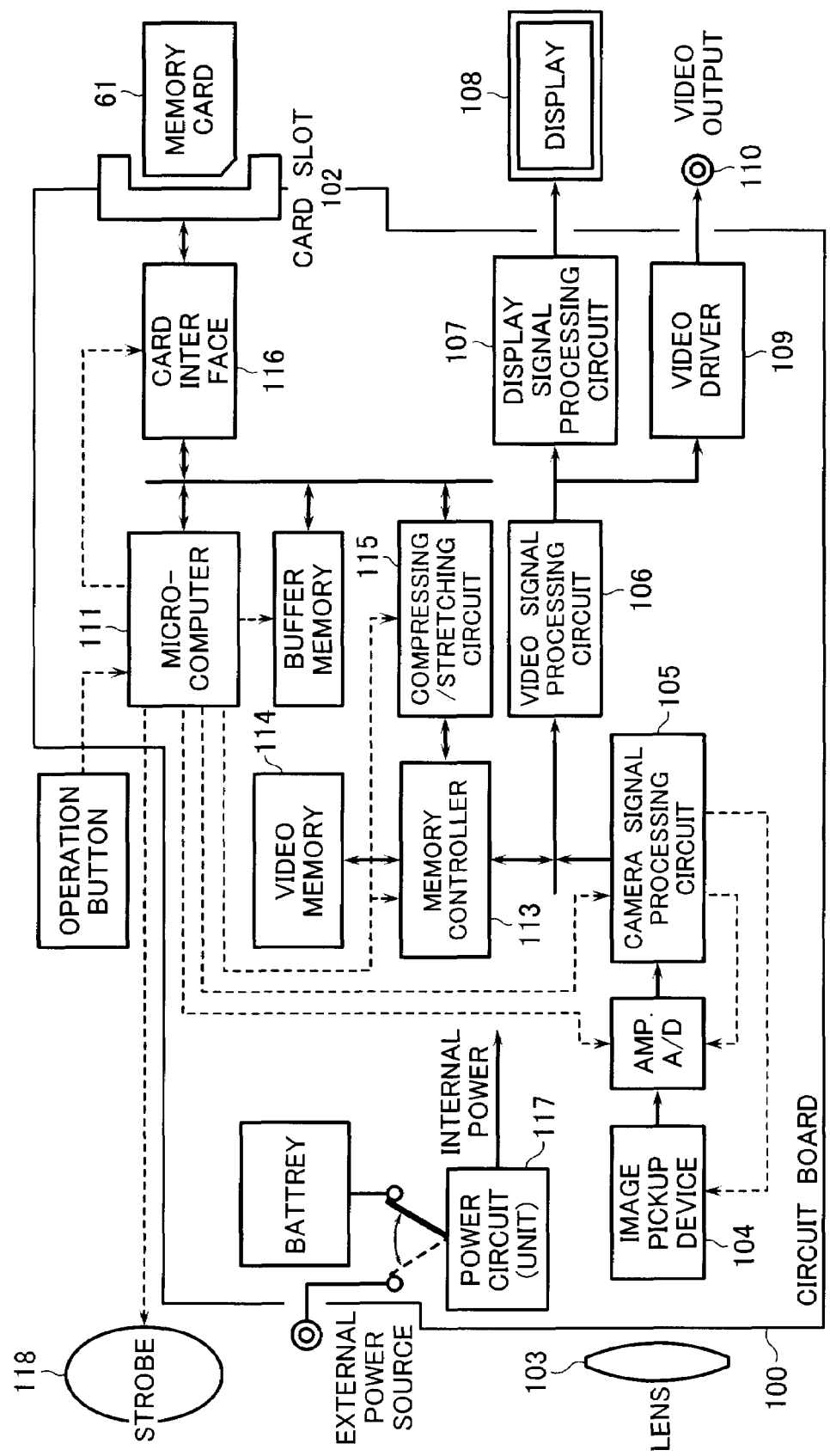
FIG. 20 shows the internal configuration of the digital still camera.
Figure 21A:
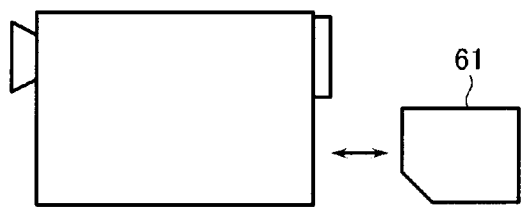
FIGS. 21A to 21J show other electric devices to which the embodiment is applied.
Figure 21F:
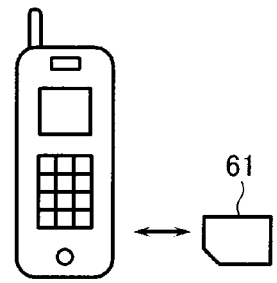
Figure 21B:
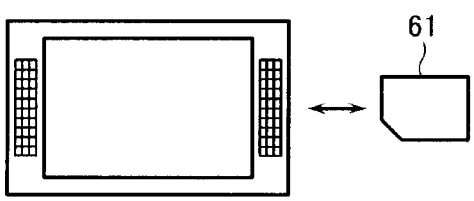
Figure 21G:
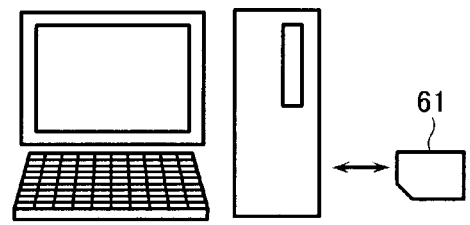
Figure 21C:
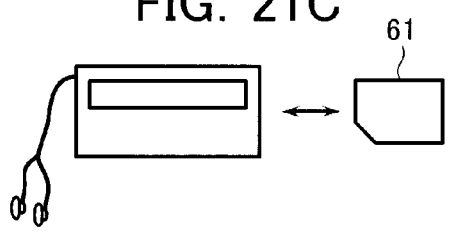
Figure 21H:
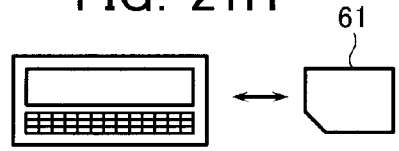
Figure 21D:
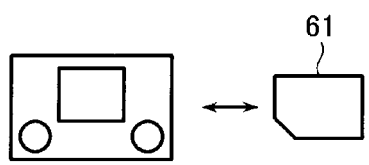
Figure 21I:
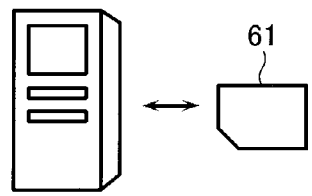
Figure 21E:
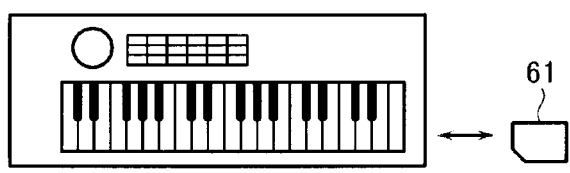
Figure 21J:
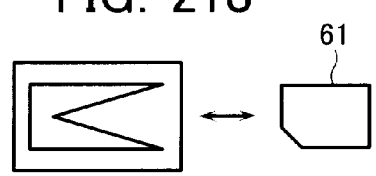

FIG. 20 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 21A to 21J, as well as in portable electric devices. That is, the electric card can also be used in a video camera shown in FIG. 21A, a television set shown in FIG. 21B, an audio apparatus shown in FIG. 21C, a game apparatus shown in FIG. 21D, an electric musical instrument shown in FIG. 21E, a cell phone shown in FIG. 21F, a personal computer shown in FIG. 21G, a personal digital assistant (PDA) shown in FIG. 21H, a voice recorder shown in FIG. 21I, and a PC card shown in FIG. 21J.

What is claimed is:

1. A semiconductor memory device comprising:
   first and second cell arrays having bit lines, word lines and electrically rewritable and non-volatile memory cells connected to the bit lines and word lines, main memory cells thereof being used as information cells for storing data while the others are used as reference cells;
   a sense amplifier disposed to be selectively coupled to a pair of bit lines selected from the first and second cell arrays, an information cell and a reference cell being coupled to the pair of bit lines, respectively; and
   a row decoder configured to selectively drive word lines in the first and second cell arrays with a voltage switching circuit for transferring a high voltage supplied to a first node to a second node in accordance with input address, wherein
   the voltage switching circuit comprises:
   a first E-type PMOS transistor disposed between the first and second nodes, the drain and gate of which are coupled to the second node and a third nodes, respectively;
   a first D-type NMOS transistor disposed between the first node and the source of the first E-type PMOS transistor, the gate of which is coupled to the second node, the first D-type NMOS transistor having a breakdown voltage higher than that of the first E-type PMOS transistor;
   a second E-type PMOS transistor disposed between the first and the third node, the drain and gate of which are coupled to the third node and the second node, respectively;
   a second D-type NMOS transistor disposed between the first node and the source of the second E-type PMOS transistor, the gate of which is coupled to the third node, the second D-type NMOS transistor having a breakdown voltage higher than that of the second E-type PMOS transistor;
   a first E-type NMOS transistor disposed between the second node and the ground potential node to be on-driven at a non-selected time and off-driven at a selected time;
   a third D-type NMOS transistor disposed between the second node and the drain of the first E-type NMOS transistor to be on/off-driven simultaneously with the first E-type NMOS transistor, the third D-type NMOS transistor having a breakdown voltage higher than that of the first E-type NMOS transistor;
   a second E-type NMOS transistor disposed between the third node and the ground potential node to be off-driven at the non-selected time and on-driven at the selected time; and
   a fourth D-type NMOS transistor disposed between the third node and the drain of the second E-type NMOS transistor to be on/off-driven simultaneously with the second E-type NMOS transistor, the fourth-D-type NMOS transistor having a breakdown voltage higher than that of the second E-type NMOS transistor.

2. The semiconductor memory device according to claim 1, wherein the voltage switching circuit further comprises:
   a fifth D-type NMOS transistor connected in parallel with the first D-type NMOS transistor to be on-driven at the selected time, the fifth D-type NMOS transistor having a breakdown voltage higher than the first E-type PMOS transistor; and
   a sixth D-type NMOS transistor connected in parallel with the second D-type NMOS transistor to be on-driven at the non-selected time, the sixth D-type NMOS transistor having a breakdown voltage higher than the second E-type PMOS transistor.

3. The semiconductor memory device according to claim 1, further comprising:
   an equalize circuit disposed between the differential input nodes of the sense amplifier to equalize a selected pair of bit lines to be coupled to the sense amplifier; and
   precharge circuits disposed at the ends of the first and second cell arrays to be opposed to the sense amplifier, respectively, for precharging the selected pair of bit lines.

4. The semiconductor memory device according to claim 3, wherein
   at a bit line precharge time with the precharge circuits, not only a selected bit line but also two non-selected bit lines disposed adjacent to the selected bit line are precharged simultaneously.

5. The semiconductor memory device according to claim 1, wherein
   a write mode is so defined as to write data in multiple information cells coupled to even numbered bit lines or odd numbered bit lines simultaneously, and wherein
   adjacent two bit lines are simultaneously selected as even numbered bit lines or odd numbered bit lines in the write mode.

6. The semiconductor memory device according to claim 1, wherein
   multiple memory cells are connected in series to constitute a NAND string in the first and second cell arrays.

* * * * *